(12) United States Patent
Tschirhart

(10) Patent No.: US 11,157,804 B2
(45) Date of Patent: Oct. 26, 2021

(54) SUPERCONDUCTING NEUROMORPHIC CORE

(71) Applicant: Paul Kenton Tschirhart, Crofton, MD (US)

(72) Inventor: Paul Kenton Tschirhart, Crofton, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 426 days.

(21) Appl. No.: 16/258,174

(22) Filed: Jan. 25, 2019

(65) Prior Publication Data

US 2020/0242452 A1    Jul. 30, 2020

(51) Int. Cl.
| | |
|---|---|
| *G06N 3/063* | (2006.01) |
| *G06N 3/04* | (2006.01) |
| *G06N 3/06* | (2006.01) |
| *G06N 10/00* | (2019.01) |
| *H01L 39/22* | (2006.01) |

(52) U.S. Cl.
CPC ............ *G06N 3/063* (2013.01); *G06N 3/049* (2013.01); *G06N 3/061* (2013.01); *H01L 39/223* (2013.01); *G06N 10/00* (2019.01)

(58) Field of Classification Search
CPC ...... G06N 3/063; G06N 3/0635; G06N 10/00; H01L 39/223
See application file for complete search history.

(56) References Cited

U.S. PATENT DOCUMENTS

| | | |
|---|---|---|
| 4,874,963 A | 10/1989 | Alspector |
| 8,275,727 B2 | 9/2012 | Elmegreen et al. |
| 8,275,728 B2 | 9/2012 | Pino |
| 8,515,885 B2 | 8/2013 | Modha |

(Continued)

OTHER PUBLICATIONS

Schneider, Michael L., Christine A. Donnelly, and Stephen E. Russek. "Tutorial: High-speed low-power neuromorphic systems based on magnetic Josephson junctions." Journal of Applied Physics 124.16 (2018): 161102. (Year: 2018).*

(Continued)

*Primary Examiner* — Benjamin P Geib
(74) *Attorney, Agent, or Firm* — Tarolli, Sundheim, Covell & Tummino LLP

(57) ABSTRACT

A superconducting neuromorphic pipelined processor core can be used to build neural networks in hardware by providing the functionality of somas, axons, dendrites and synaptic connections. Each instance of the superconducting neuromorphic pipelined processor core can implement a programmable and scalable model of one or more biological neurons in superconducting hardware that is more efficient and biologically suggestive than existing designs. This core can be used to build a wide variety of large-scale neural networks in hardware. The biologically suggestive operation of the neuron core provides additional capabilities to the network that are difficult to implement in software-based neural networks and would be impractical using room-temperature semiconductor electronics. The superconductive electronics that make up the core enable it to perform more operations per second per watt than is possible in comparable state-of-the-art semiconductor-based designs.

20 Claims, 20 Drawing Sheets

(56) References Cited

U.S. PATENT DOCUMENTS

| | | | |
|---|---|---|---|
| 8,604,944 | B2 | 12/2013 | Berkley et al. |
| 8,812,414 | B2 | 8/2014 | Arthur et al. |
| 8,909,576 | B2 | 12/2014 | Akopyan et al. |
| 8,996,430 | B2 | 3/2015 | Modha |
| 10,103,736 | B1 | 10/2018 | Powell, III et al. |
| 10,505,095 | B2 * | 12/2019 | Schneider ............ G06N 3/0635 |
| 2015/0324684 | A1 | 11/2015 | Alvarez-Icaza Rivera et al. |

OTHER PUBLICATIONS

Bozbey, Ali, et al. "Single flux quantum based ultrahigh speed spiking neuromorphic processor architecture." arXiv preprint arXiv: 1812.10354 (2018). (Year: 2018).*

Merolla, et al.: "A Million Spiking-Neuron Integrated Circuit with a Scalable Communication Network and Interface"; found on the Internet Jan. 24, 2019 at: http://paulmerolla.com/merolla_main_som.pdf.

Chiarello, et al.: "Artificial Neural Network based on SQUIDs: demonstration of network training and operation"; Superconductor Science and Technology, vol. 26, No. 12; Published Oct. 18, 2013, 2013 IOP Publishing Ltd.

Schegolev, et al.: "Adiabatic Superconducting Cells for Ultra-Low-Power Artificial Neural Networks"; This article is part of the Thematic Series "Physics, chemistry and biology of functional nanostructures III"; Beilstein J. Nanotechnol. 2016, 7, 1397-1403. doi:10.3762/bjnano.7.130.

International Search Report for International Application No. PCT/US2020/013359 dated Apr. 2, 2020.

Altay Karamuftuoglu M et al.: Single Flux Quantum Based Ultrahigh Speed Spiking Neuron, arxiv.org, Cornell University Library, 281 Olin Library Cornell University Ithaca, NY 14853, Dec. 26, 2018 (Dec. 26, 2018), XP081208407, p. 1-p. 9, left-hand col. paragraph 1.

Patrick Crotty Etal: "Josephson junction si1TUlation of neurons",arxiv. org, Cornell University Library, 281 Olin Library Cornell University Ithaca, NY 14853,Feb. 15, 2010 (Feb. 15, 2018), XP088392059,DOI: 10.11 03/PHYSREVE.82.011914 p. 1-p. 9, paragraph 3.

Nauman Ahad et al., "Neural networks in wireless networks: Techniques, applications and guidelines", J. Netw. Comput. Appl., Apr. 7, 2016, pp. 1-27, vol. 68, Elsevier Inc., United States.

Ben Varkey Benjamin et al., "Neurogrid: A Mixed-Analog-Digital Multichip System for Large-Scale Neural Simulations", Proc. IEEE, Apr. 24, 2014, pp. 699-716, vol. 102, No. 5, IEEE, United States.

Paul I. Bunyk et al., "Architectural Considerations in the Design of a Superconducting Quantum Annealing Processor", IEEE Trans. Appl. Supercond., Aug. 2014, p. 1700110, vol. 24, No. 4, IEEE, United States.

Tianshi Chen et al., "DianNao: A Small-Footprint High-Throughput Accelerator for Ubiquitous Machine-Learning", ASPLOS '14, Mar. 1, 2014, pp. 269-283, ACM, United States.

Patrick Crotty et al., "Josephson junction simulation of neurons", Phys. Rev., Jul. 19, 2010, p. 011914, vol. 82, No. 1, The American Physical Society, United States.

Steve B. Furber et al., "Overview of the SpiNNaker System Architecture", IEEE Trans. Comput., Jun. 12, 2012, pp. 2454-2467, vol. 62, No. 12, IEEE Computer Society, IOP Publishing Ltd., United Kingdom.

Steve B. Furber et al., "The SpiNNaker Project", Proc. IEEE, Feb. 27, 2014, pp. 652-665, vol. 102, No. 5, IEEE, United States.

Mutsuo Hidaka et al., "An artificial neural cell implemented with superconducting circuits", Supercond. Sci. Technol., Nov. 1991, pp. 654-657, vol. 4, No. 11, IOP Publishing Ltd., United Kingdom.

Norman P. Jouppi et al., "In-Datacenter Performance Analysis of a Tensor Processing Unit", ISCA '17, Jun. 24, 2017, ACM, Toronto, Ontario, Canada.

Alex Krizhevsky et al., "Imagenet Classification with Deep Convolutional Neural Networks", NIPS'12 Proceedings of the 25th International Conference on Neural Information Processing Systems, Dec. 3, 2012, pp. 1097-1105, vol. 1, Curran Associates Inc., Lake Tahoe, Nevada, United States.

Alex Krizhevsky et ai., "Imagenet Classificiation with Deep Convolutional Neural Networks", Common. ACM, Jun. 2017, pp. 84-90, vol. 60, No. 6, ACM, United States.

Yoshinao Mizugaki et al., "Implementation of New Superconducting Neural Networks Using Coupled SQUIDs", IEEE Trans. Appl. Supercond., Mar. 1994, pp. 1-8, vol. 4, No. 1, IEEE, United States.

Johannes Schemmel et al., "A Wafer-Scale Neuromorphic Hardware System for Large-Scale Neural Modeling", Proceedings of 2010 IEEE International Symposium on Circuits and Systems, May 30, 2010, pp. 1947-1950, IEEE, Paris, France.

Swagath Venkataramani et al., "Scaledeep A Scalable Compute Architecture for Learning and Evaluating Deep Networks", ACM SIGARCH Computer Architecture News—ISCA'17, May 2017, pp. 13-26, vol. 45, No. 2, ACM, United States.

* cited by examiner

FIG. 15E

SUPERCONDUCTING NEUROMORPHIC CORE

TECHNICAL FIELD

The present invention relates generally to quantum and classical digital superconducting circuits, and specifically to a superconducting neuromorphic core.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

Neuromorphic computing describes the use of very-large-scale integration (VLSI) systems containing electronic analog circuits, electronic digital circuits, mixed-mode analog/digital VLSI circuits, and/or software systems to implement models of neural systems for perception, motor control, or multisensory integration so as to mimic neuro-biological architectures present in biological nervous systems of humans and other animals. In particular, neuromorphic computing endeavors to apply an understanding of the morphology and function of individual neurons, circuits, and/or neural architectures to engineer new computational platforms. Such understanding can include insight as to how neurons and neural structures affect how information is represented, how they influence robustness to damage, how they incorporate learning and development, how they adapt to local change (plasticity), and how they facilitate evolutionary change. As examples, efforts have been made to implement neuromorphic computing on the hardware level using oxide-based memristors, spintronic memories, threshold switches, and transistors. Large-scale neuromorphic processors have been designed that are capable of simulating networks of up to one million neurons. However, these designs require many chips or simplified neuron representations in order to achieve their scale.

The central processing units (CPUs) of computer systems can be complemented with special purpose coprocessors, called accelerators, for specialized tasks. Development of such specialized hardware units incorporating neural networks to accomplish tasks using biologically inspired computation models is ongoing. Such neural network accelerators are designed to quickly perform digital math required by software machine learning algorithms. These systems do not try to model the biological neuron, but instead attempt to optimize data movement and arithmetic performance in order to process software-defined neural networks more quickly. Neuron models currently used in software-defined neural networks are greatly simplified, and so some capabilities are lost in the network as a whole. This is because it is not practical to calculate complex neuron models in software for all neurons in a large software-defined neural network, even with the aid of an arithmetic accelerator. For example, many existing neural networks use simplified neuron models, such as the "leaky integrate and fire" neuron model, that do not fully replicate the complex behaviors and all of the distinct states of biological neurons. The leaky integrate-and-fire model improves upon the "integrate-and-fire" model of the neuron by adding a "leak" term to the membrane potential, reflecting the diffusion of ions that occurs through the membrane when some equilibrium is not reached in the cell, thus implementing a time-dependent memory. However, this model and other simplified models do not sufficiently enable accurate neural functionality in neural networks.

Neural network computation on serial computers is too slow to produce useful results for many applications and lacks the fault-tolerance advantages of parallel architectures. However, implementation in room-temperature semiconductor electronics of the massively parallel architectures needed for large-scale neural network computation poses issues of power dissipation because of the large number of interconnections involved. Superconducting Josephson circuits provide higher speed operation with much lower power dissipation, but to date, research in the area of superconducting neural networks has focused either on the development of neuron components, such as soma circuits, or on proof-of-concept networks that are not programmable or scalable.

In the rate-coding model of neuronal firing, information is carried by the rate of presentation of incoming spikes, i.e., in the number of incoming spikes presented to a neuron within a certain period, but not necessarily by the timing relationship between spike arrivals. In contrast, in the temporal-coding model of neuronal firing, information can be carried by precise spike timing or high-frequency firing-rate fluctuations. Thus, as an example, temporal coding allows one incoming spike sequence represented by the bitstream 000111000111 to have different meaning from another incoming spike sequence, delivered over the same amount of time, represented by the bitstream 001100110011, even though the mean firing rate is the same for both sequences, at six spikes per time period.

SUMMARY

One example includes a superconducting neuromorphic core. The core includes input lines to receive single flux quantum (SFQ) pulses, and a superconducting digital memory array to store synapse weight values in columns corresponding to different neural synapses that provide inputs to a single neuron simulated by the core and in rows corresponding to different neurons sequentially simulated by the core. The core further includes a superconducting digital accumulator configured to sum synapse weight values retrieved from the memory array during an accumulation time period, and a superconducting digital-to-analog converter configured to convert the summed-weight accumulator output into an analog signal. The core further includes superconducting analog soma circuitry configured to provide an SFQ pulse as an output of the core based on the analog signal exceeding a threshold.

Another example includes a method wherein an input signal is received as an input SFQ pulse representing an action potential generated by a simulated neuron. A synapse weight value is accessed from a superconducting digital memory array based on the input signal. Synapse weight values accessed during a time period are accumulated, and the accumulated weight values are converted to an analog signal. Then, an output signal is emitted as an output SFQ pulse based on a comparison of the analog signal to a threshold.

Yet another example includes a programmable hardware-based artificial neural network. The neural network includes a superconducting integrated circuit having at least one neuromorphic core, the at least one neuromorphic core being configured to sequentially simulate multiple neurons in the neural network. The at least one neuromorphic core has a superconducting digital memory array and superconducting analog soma circuitry. The memory array has column select lines and row select lines configured to select a word in the digital memory array representative of a programmable weight associated with a particular synaptic input of a particular neuron simulated by the at least one neuromorphic core during a system cycle. The soma circuitry is configured to provide an SFQ pulse as an output of the neuromorphic core based on processed outputs from the digital memory array.

BRIEF DESCRIPTION OF THE DRAWINGS

FIGS. 15A, 15B, 15C, 15D, and 15E are a timing diagram illustrating another example of pipelined operation of a neuromorphic core.

DETAILED DESCRIPTION

Figure 1:
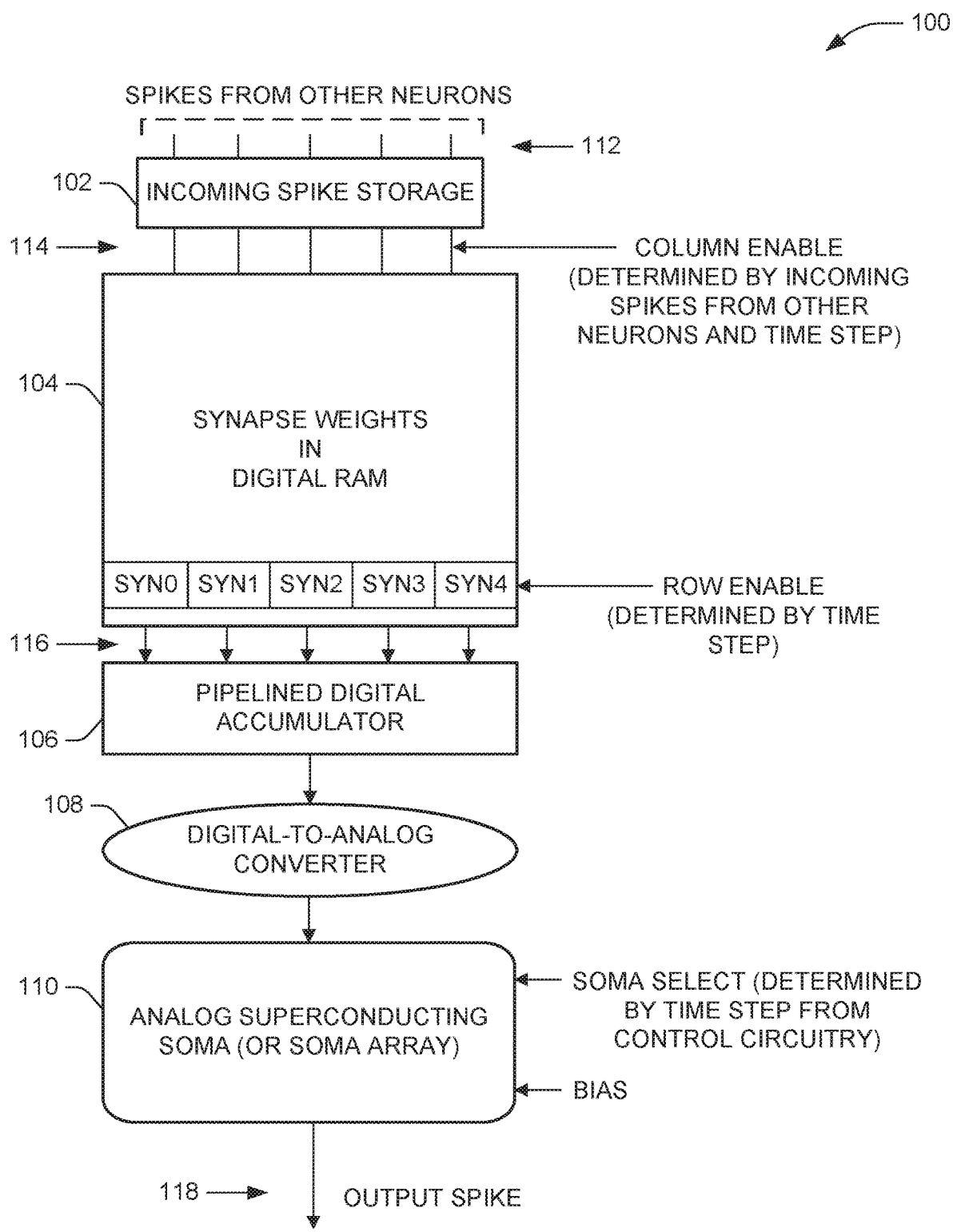
FIG. 1 is a block diagram of an example neuromorphic core.

A superconducting neuromorphic pipelined processor core can be used to build neural networks in hardware by providing the functionality of somas, axons, dendrites and synaptic connections. A single instance of the superconducting neuromorphic pipelined processor core described herein can implement a programmable and scalable model of one or more biological neurons in superconducting hardware that is more efficient and biologically suggestive than existing designs. The described neuromorphic core can be used to build a wide variety of large-scale neural networks in hardware. For example, one core, or a network of cores representing potentially millions of neurons, can be fabricated on a single superconducting integrated circuit (a "chip") or on a collection of chips that can be cooled to cryogenic temperatures in a cold space for superconducting operation at microwave-frequency clock speeds. The biologically suggestive operation of the neuromorphic core provides additional capabilities to the network that are difficult to implement in software-based neural networks and would be impractical using room-temperature semiconductor electronics. The superconducting electronics that make up the described neuromorphic core enable it to perform more operations per second per watt than is possible in comparable state-of-the-art semiconductor-based designs.

Scalability poses a major challenge in neural network circuit design. In particular, approaches that combine superconducting loops to create simple neural networks are not scalable to large-scale neural networks, i.e., to the thousands, hundreds of thousands, or millions of neurons necessary for complex artificial intelligence and deep learning computing applications. This is because, among other reasons, present fabrication technologies do not provide enough wiring layers to accommodate the large number of interconnects between neuron components to support a setup wherein a large number of neurons are each fed by inputs from hundreds of other neurons. Even if such interconnect routing could be designed within the constraints of present fabrication methods, the interconnect routing would necessarily consume so much space on a chip that not enough neurons could be fit on the chip to support large-scale neural networks.

Based in part on the observation that not all the logical neurons in an artificial neural network need to be computationally represented simultaneously and that hardware sharing can thus be an acceptable and beneficial approach, the presently described systems and methods address these scalability challenges while also providing other benefits, including programmability. The presently described systems and methods further make use of the recognition that an array of superconducting digital memory can act as synapses for input to a soma implemented as analog superconducting logic and that certain arrangements as described herein can permit the single soma, or an array of multiple soma, to provide the functionality of numerous different logical neurons in a neural network, providing efficiency advantages.

The absence of large, workable superconducting memories has influenced design decisions in the creation of superconducting neural networks. The present systems and methods are designed to leverage recent advances in superconducting memory technology and to incorporate arrays of superconducting digital memories into neuromorphic core designs. In particular, the systems and methods described herein can connect a superconducting digital memory array to an artificial soma cell body, with the array of superconducting digital memory acting as conceptual synapses to provide inputs to a conceptual soma implemented as analog superconducting circuitry. By suitably organizing the memory array and its connection to the soma, the memory array can represent synapses for multiple neurons. For example, columns of the memory array can represent synaptic connections between two different neurons, i.e., particular weights describing how much each of the outputs of a set of input neurons influences the behavior of a neuron to which each input neuron is conceptually connected and for which the neuromorphic core computes an output response. Rows of the memory array can represent different neurons for which the neuromorphic core computes an output response. Thus, the width of the memory array determines the maximum number of input synapses each neuron can have, and the depth of the memory array determines the maximum number of neurons that a single neuromorphic core can compute output responses for.

FIG. 1 illustrates an example superconducting neuromorphic core 100 as including five elements: an incoming spike buffer 102, a synapse memory bank 104, a pipelined digital accumulator 106, a digital-to-analog converter (DAC) 108, and an analog soma circuitry 110. Accumulator 106 and DAC 108 together interface superconductive memory array 104 with biologically suggestive superconducting soma circuitry 110, by accumulating the total incoming weight of synapse connections for a neuron and then converting the resultant digital value into a proportional superconducting current to apply to soma circuitry 110. As discussed herein, a single instance of core 100 can itself represent a neural network, and/or a plurality of instances of core 100 can be connected together, either directly or using an intermediary digital signal distribution network, to create a neural network. Each instance of core 100 can correspond to, and can calculate the neural response (i.e., the activation) of, a signal logical neuron or, as illustrated and described below, multiple logical neurons in a neural network. The neuromorphic core 100 of FIG. 1 provides scalability advantages not realized with prior systems while providing additional benefits owing to its mixed digital/analog design and the greater fidelity of its design to the operation of biological neurons.

Figure 2:
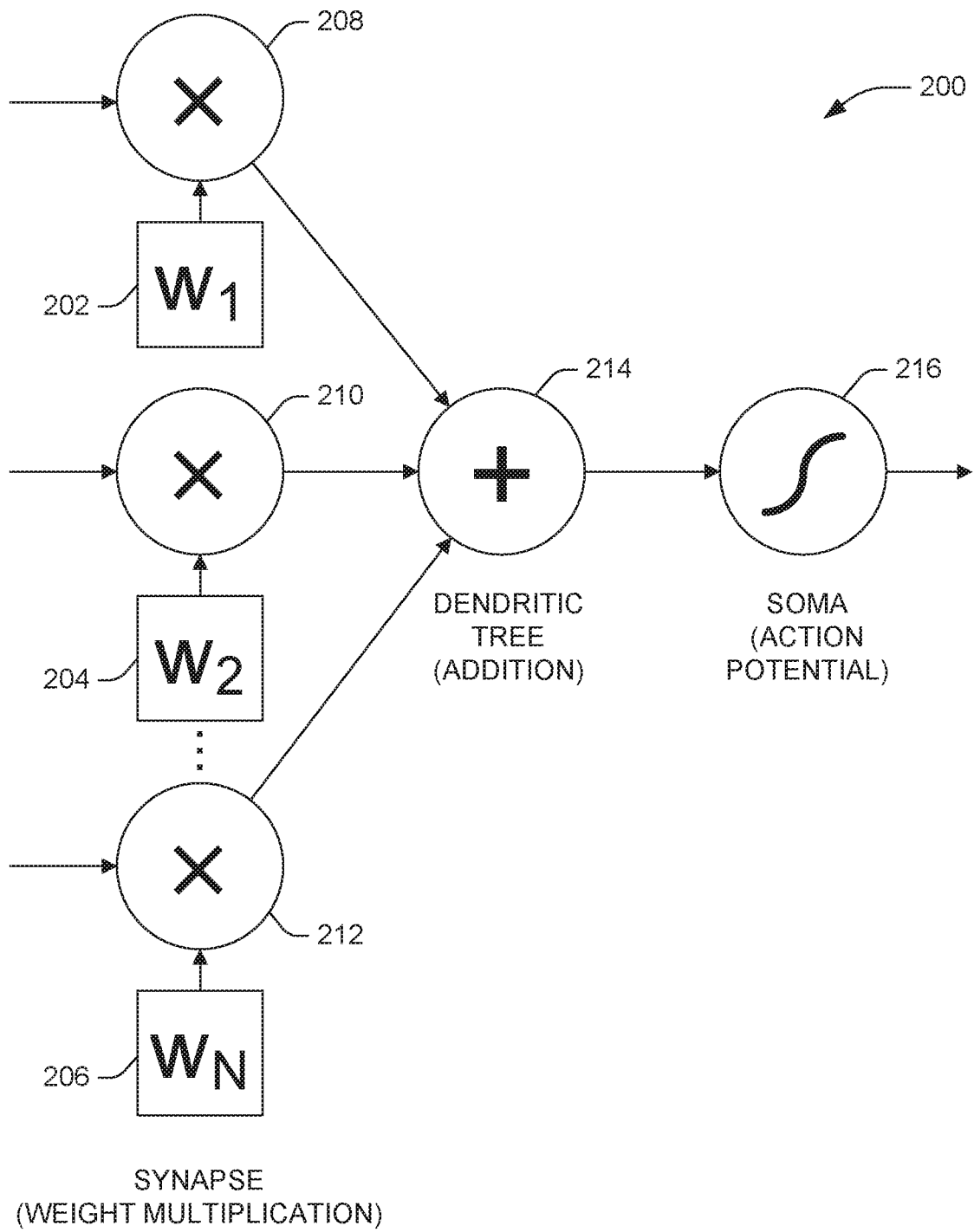
FIG. 2 is a conceptual diagram of an example neuron.

FIG. 2 illustrates a conceptual diagram of an example model non-spiking artificial neuron 200 consisting of an integer number N inputs (at the left), four kinds of elements, and a single output (at the right). Neuron 200 can be one among many in a neural network. The four elements of which neuron 200 is composed include N synapse weight storage devices 202, 204, 206, N synapses 208, 210, 212, a dendritic tree 214, and a soma 216. The illustrated example shows only three synapses with corresponding weight storage devices, but a neuron can have an arbitrary number N of each of these, as indicated by ellipsis. Each weight storage device 202, 204, 206 can be, for example, a register, which can be a register in a larger memory containing many such registers. Each synapse 208, 210, 212 can be, for example, a multiplier that modulates incoming action potentials according to the synapse weights. The dendritic tree 214 of neuron 200 can be, for example, an accumulator that sums the weighted incoming action potentials to create one input to the soma 216. The soma 216 can be, for example, a comparator configured to compare the single output of the dendritic tree 214 to a threshold and to thereby determine whether to emit an action potential as the output of the neuron 200. In model 200, incoming action potentials and weights can both be represented as, for example, decimal values that are then multiplied together to determine the contribution from each synapse to the soma.

Figure 3:
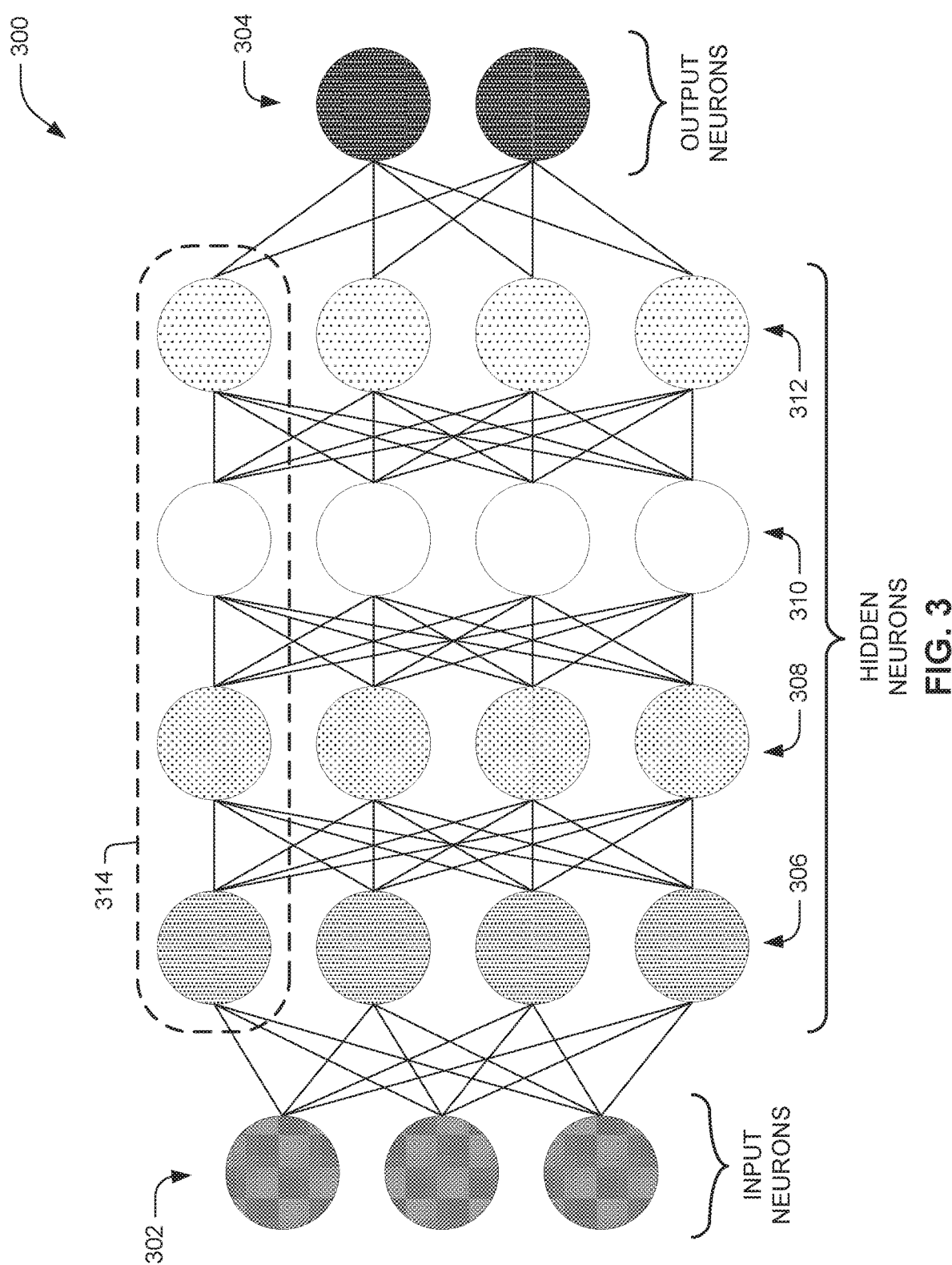
FIG. 3 is a conceptual diagram of an example neural network.

FIG. 3 illustrates a conceptual diagram of an example artificial neural network 300 organized as at least three layers of neurons connected to each other by weighted synapses, each neuron being illustrated as a circle and each weighted synapse being illustrated as a straight line between two respective neurons in the diagram of FIG. 3. The layers can include at least one layer 302 of input neurons, at least one layer 304 of output neurons, and one or more layers 306, 308, 310, 312 of "hidden" neurons in between the input and output layers 302, 304, the function of which is to transform inputs to the neural network 300 into suitable outputs. Multiple layers of hidden neurons are possible, which can enable "deep learning" solutions in applications such as computer vision, speech recognition, natural language processing, audio recognition, social network filtering, machine translation, bioinformatics, drug design, medical image analysis, material inspection, games and simulations, and others. In some examples, as few as one hidden layer suffices; four hidden layers 306, 308, 310, 312 are shown in the diagram of FIG. 3, but some examples may include more than four hidden layers.

Neural network 300 can be trained using supervised or unsupervised training. Supervised training can be accomplished by the back propagation of error, using such techniques as stochastic gradient descent. Network 300 can be feed-forward or recurrent. FIG. 3 shows but one example among numerous types of neural network configurations, which have been classed in the literature according to various taxonomies. As such, different network functionality can be achieved by connecting the same components in different ways. Examples of neural network taxonomies are given in Fjodor van Veen's 2016 Asimov Institute chart or the article by Nauman Ahad et al., *Neural networks in wireless networks: Techniques, applications and guidelines*, 68 J. NETW. COMPUT. APPL. (2016).

Figure 9:
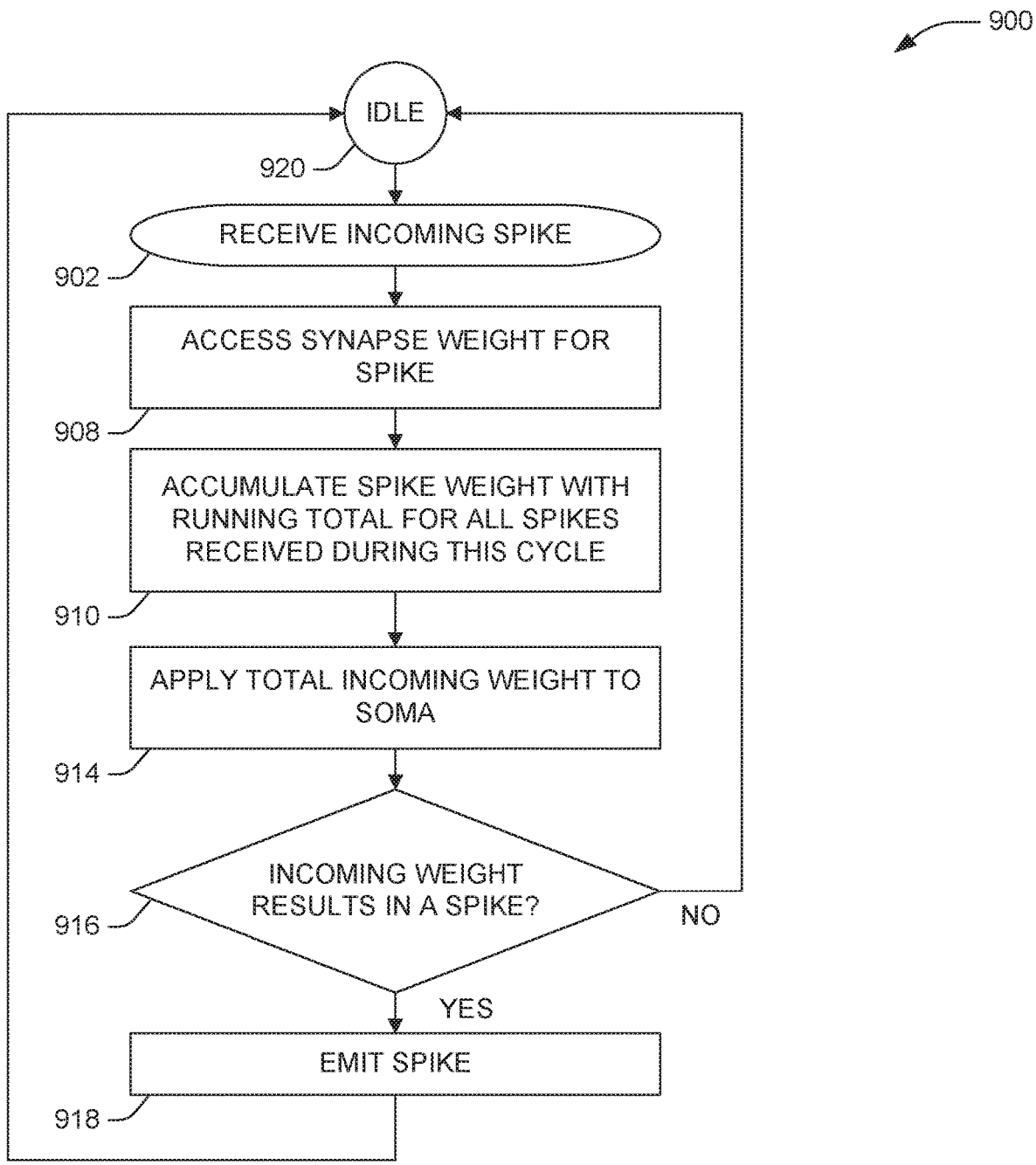
FIG. 9 is a flow diagram illustrating the operation of a neuromorphic core without a spike buffer, or configured not to hold spikes in a spike buffer, and configured to apply accumulated weight to a soma continuously.
Figure 10:
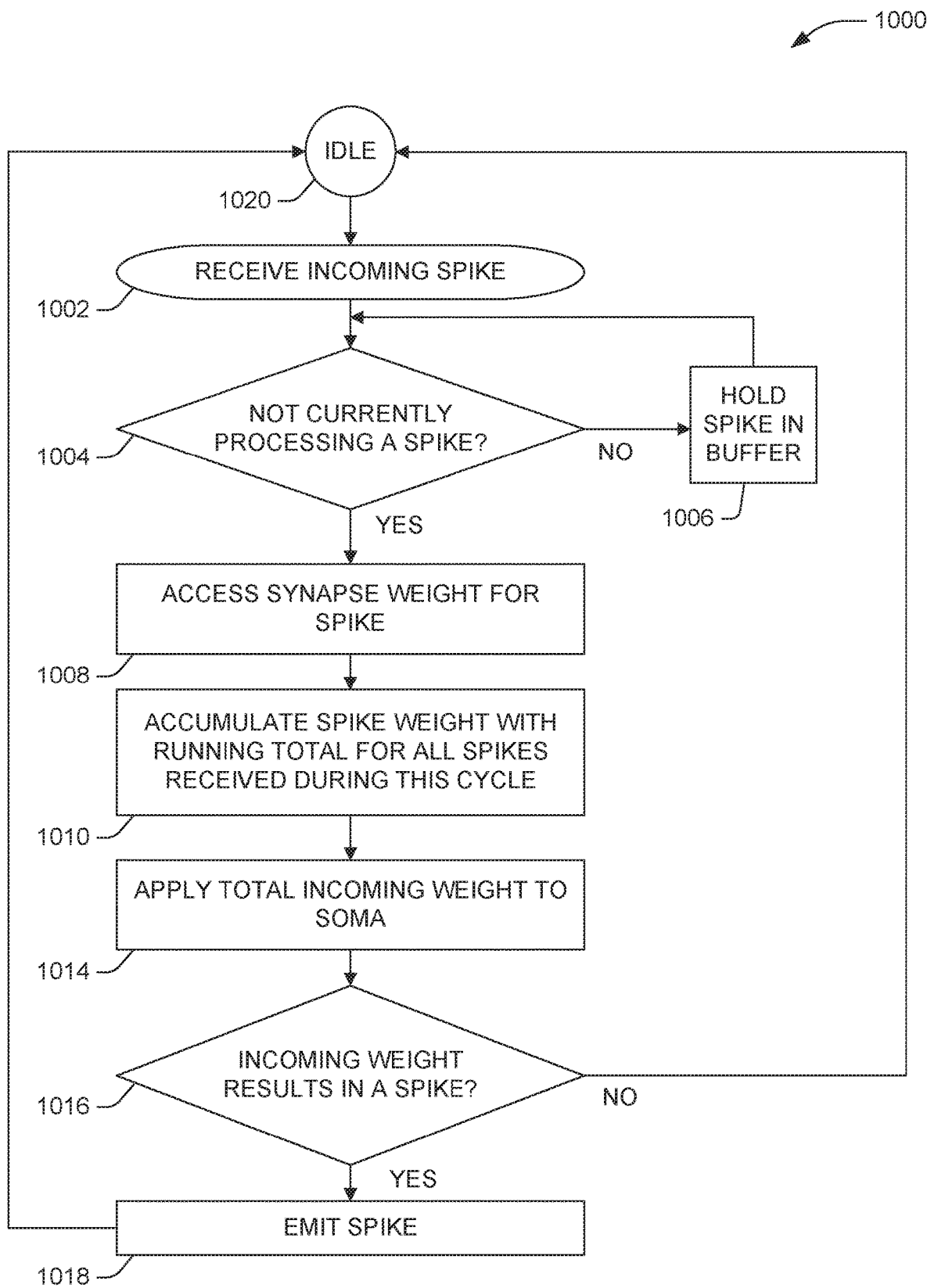
FIG. 10 is a flow diagram illustrating the operation of a neuromorphic core with a spike buffer, and configured to apply accumulated weight to a soma continuously.

Each layer in the neural network 300 can be thought of as separated in time: the outputs of the neurons in layer 312 can be computed after the outputs of the neurons in layer 310, the outputs of the neurons in layer 310 can be computed after the outputs of the neurons in layer 308, and so forth. Accordingly, when the network is implemented using one or more neuromorphic cores as described herein, the hardware of one neuromorphic core 100 can be used to represent multiple neurons in different layers, such as group of neurons 314 in FIG. 3. Local memory 104 in FIG. 1 provides a natural networking point for routing layout, since all inputs come into the local memory 104 at the core 100, facilitating routing for large systems having many thousands of neurons. FIG. 9 illustrates the connection of four cores as an example, but a greater number of cores can be connected by extending the example of the drawing, and by substituting a superconducting digital distribution network for the interconnects, as shown in FIG. 10.

Figure 4:
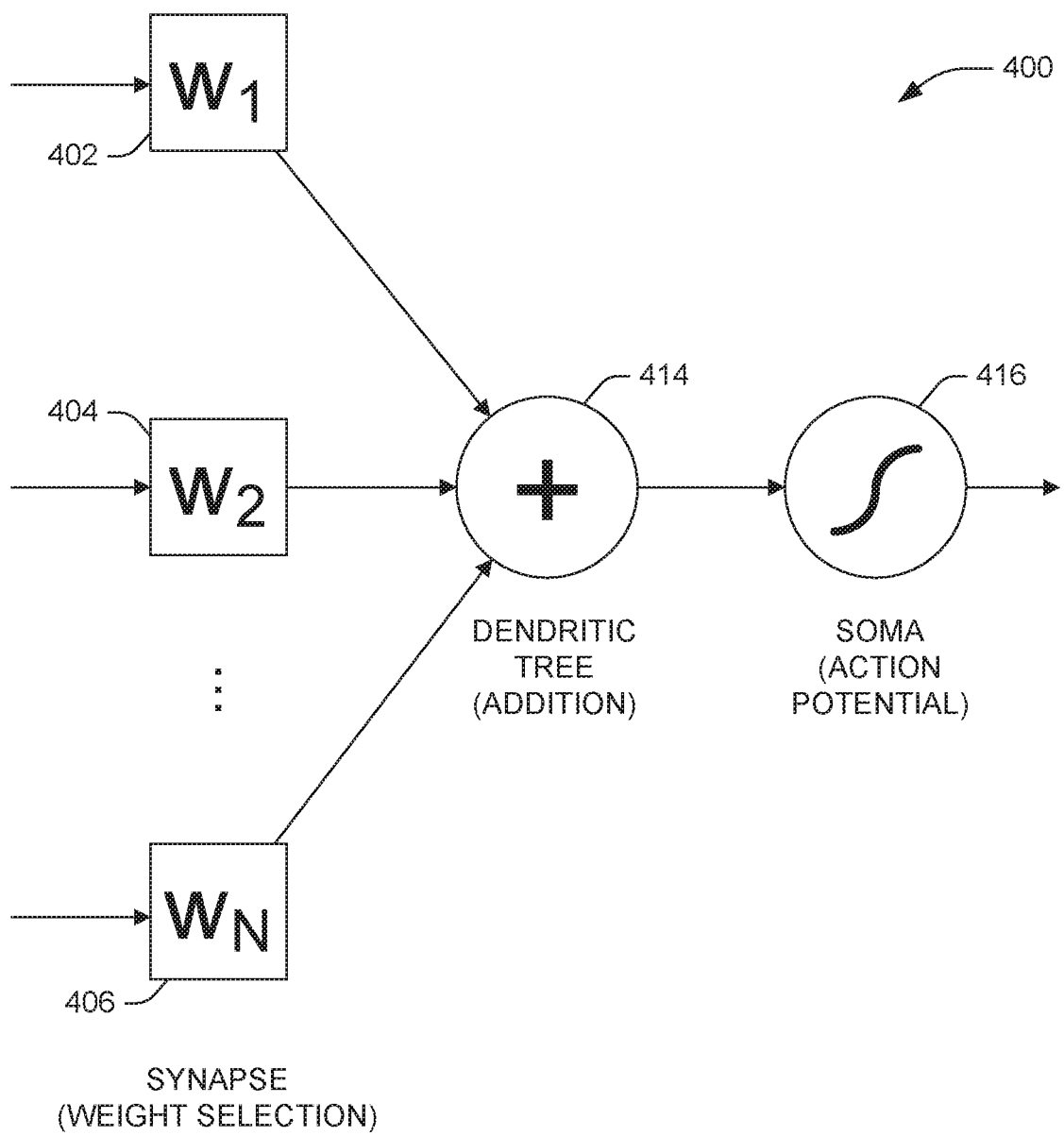
FIG. 4 is a conceptual diagram of an example neuron.

FIG. 4 illustrates another conceptual diagram of an example neuron 400, similar to that of example neuron 200 in FIG. 2, except that the multiplication synapses have been eliminated owing to the recognition that in a digital model, all input signals (i.e., "spikes") are either a logical high value (e.g., logical "1") or a logical low value (e.g., logical "0"), or, expressed in terms of the logic carriers in reciprocal quantum logic (RQL) systems, the input signals consist of either a signal flux quantum (SFQ) pulse or the absence of an SFQ pulse. Rather than take the unnecessary step of multiplying weights by a one or a zero, the neuron model 400 in essence turns input signal lines into enable lines fed directly into synapse weight storage devices 402, 404, 406 to respectively either enable or not enable the outputs of the weight values stored therein. The dendritic tree 414 and the soma 416 can behave and be constructed as described previously with respect to the corresponding components 214, 216 of neuron 200 of FIG. 2. The re-arrangement of the neuron model depicted in FIG. 4 better depicts the handling of signals in the core 100 of FIG. 1, wherein synapse weights can effectively be selected from a superconducting memory array 104 by input lines providing spikes in the form of SFQ pulses. Thus, because weights are represented as decimal values but incoming action potentials are represented as binary, as compared to model 200, model 400 eliminates the need for digital multiplication while still closely replicating biological neurons.

A neuromorphic core of a type described herein, such as core 100 in FIG. 1, can operate using multiple clocks to organize its behavior. A digital clock, also referred to herein as a logic clock, can be used by the digital components of the neuromorphic core to coordinate their operation. Such a digital clock can be the fastest clock used in the neuromorphic core and can form the basis for other clocks. Another clock that can be included in some examples is an action potential clock, which can also called a rhythm clock. The action potential clock can determine how frequently a neuromorphic core produces a spike (i.e., how frequently a neuron fires) and can help to organize and synchronize the firing of groups of neurons, when desired. The period of the action potential clock can be determined by the size of the spike buffer, the refractory period of the soma circuit, the latency of the neuromorphic core's pipeline, the control circuitry of the network, the desired spiking frequency of a neuron, and other factors. The period of the action potential clock can be, for example, an integer multiple of the digital clock. Multiple action potential clocks could be used by the neuromorphic cores to implement a network with neurons that fire at different rates (i.e., produce action potentials at different frequencies). Another clock that can be included in some examples is the system clock, which can also be called a layer clock. The system clock can determine which layer of a neural network is currently being processed (i.e., computed) by the neuromorphic core. The system clock can be, for example, an integer multiple of the action potential clock. Networks implemented with one or more neuromorphic cores that are not organized into strict layers need not necessarily make use of a system clock. Many combinations of the other clocks are possible.

Returning attention again to FIG. 1, incoming spikes from other neurons (i.e., neurons that are presynaptic to a neuron whose response is computed by core 100) can be received by incoming spike buffer 102 along input lines 112. Five input lines are shown in the illustrated example, but other examples can have more or fewer input lines. The number of input lines (also termed column enable signals) can correspond to the number of presynaptic neurons that are connected to the core 100. The incoming spike buffer 102 can be implemented as superconducting digital logic, e.g., as logic of the RQL family, and can be configured either to latch incoming spikes from other neurons for later use, or to allow them to pass through to the synapse memory bank 104 for immediate use, or both, depending on the state of the core 100. Buffer 102 can be implemented, for example, as an array of D latches.

In some examples, incoming spike buffer 102 can be organized as a first-in, first-out (FIFO) buffer, wherein each cycle has an entry in the buffer. On cycles when a spike is received, a "1" entry, for example, is added to incoming spike buffer 102 that indicates which synapse is to be enabled in the synapse memory bank 104. During cycles in which no spike is received, a "0" entry, for example, can be added to the buffer. Stated another way, the buffer can be configured to represent input signals received during respective time periods as one of two binary states and to represent the absence of input signals received during other respective time periods as the other of the two binary states. By adding a new entry every digital cycle even when no incoming spike is received, the timing relationship between spike arrival times is preserved in the buffer 102. If multiple spikes are received in the same digital cycle, they are added to the buffer one at a time across the next digital cycles. In some examples, the digital clock can be significantly faster than the action potential clock, such that the timing of adjacent spikes in incoming spike buffer 102 appear to the soma circuitry 110 as nearly simultaneous. Adding additional control and functional units to the neuromorphic core 100 to increase its parallelism can enable the neuromorphic core 100 to process more than one input spike at a time, thus making it possible to avoid dropping spikes, as in instances when multiple spikes arrive near the end of an action potential cycle. In such cases, spikes are only lost in examples of the invention that receive more spikes than they can process in the available time before the end of the action potential or system cycle, as is explained in greater detail with reference to the timing diagrams of FIGS. 14A-14B and 15A-15E. In some examples, incoming spike buffer 102 can be used to store spike(s) generated in one layer so that they can be applied to neurons in a next layer. The buffer can be implemented at various sizes to accommodate a desired number of digital cycles. Buffer 102 can also be omitted from certain implementations of core 100 if handling of complex spike arrival times is not needed or desired. Whether incoming spikes are latched or passed through or both, a spike arriving at a particular line among input lines 112 can transmitted to a corresponding line among column enable lines 114.

The synapse memory bank 104 can be a superconducting digital random access memory configured to store the weights for each synapse connected to a neuron that is implemented by neuromorphic core 100. For example, the memory words that make up a single row of the memory array can each correspond to a weight for a particular synapse. Column enable lines 114, which select which word is read out, can be the same signal as the incoming spike (i.e., either provided by incoming spike storage 102 or, if storage 102 is omitted, directly from a presynaptic neuron), and the location of the corresponding presynaptic neuron can thus determine which word is enabled. When a pulse is received on a column input (labeled as "spikes from other neurons" in FIG. 1), the corresponding weight value is read out of the memory on the corresponding column output among column output lines 116. When no pulse is received on a column input, a weight of zero is read out on the corresponding column output among column output lines 116.

In examples where the neuromorphic core simulates part of a layered neural network, each of the rows of the memory 104 can then correspond to a particular layer of the larger neural network of which any logical neuron represented by a particular instance of core 100 is a part. The row enable can thus be provided by state machine control circuitry (not shown), and can correspond to a current logical neuron whose response is being calculated by the instance of core 100. Accordingly, the number of layers in the simulated neural network (refer, e.g., to FIG. 3) can determine the number of rows in memory 104 and likewise the number of row enable control lines (not shown in FIG. 1) coming from the state machine control circuitry (not shown) to memory 104. In this way, a single physical neuron core 100 can be used to compute the activations for many logical neurons throughout the network in a time-multiplexed fashion. Which row of the memory 104 is activated can be controlled by the state machine control circuitry, which, in some examples, simply advances rows of the memory, one at a time, effectively walking through successive neurons, and thus in some example's successive layers in the neural network, with each row advance. Accordingly, one core 100 can be configured, for example, as representing multiple neurons in a path in the neural network, such as those neurons encircled in broken line 314 in FIG. 3. Which particular neuron in the path 314 is being simulated by the core 100 at any particular time can therefore be determined by the time step and thus by the aforementioned state machine control circuitry. The choice of implemented size of the memory can depend on a desired number and precision of synapse weights. In some other examples, with appropriate modification to the buffer, one row of the memory array can be used to store synapse weight values for a first simulated neuron in a layer of an artificial neural network, and another row of the memory array can be used to store synapse weight values for a second simulated neuron in the same layer of the artificial neural network.

The memory 104 can be implemented as any of several different types of superconducting memory, including passive memory arrays or non-destructive readout (NDRO) arrays. Each different type of memory may have different performance characteristics, so the choice of memory technology may alter the timing of a superconducting neural network system incorporating one or more neuromorphic cores of the type shown in FIG. 1, but the overall functionality of the system would not change with choice of memory technology. The memory may be configured to preserve the timing between synapse activations through pipelining, through selecting a digital cycle time equal to the memory latency, or in some other way. The memory 104 can be implemented, for example, using RQL-compatible memories. Suitable arrays of superconducting memory cells are described, for example, in U.S. Pat. No. 9,520,181 B1 to Miller et al., entitled "Superconducting Phase-Controlled Hysteretic Magnetic Josephson Junction JMRAM Memory Cell"; in U.S. Pat. No. 9,812,192 B1 to Burnett et al., entitled "Superconducting Gate Memory Circuit"; and in U.S. patent application Ser. No. 16/051,058 to Herr et al., entitled "Superconducting Non-Destructive Readout Circuits". These disclosures are each incorporated by reference.

The straightforward programmability of the superconducting memory bank 104 facilitates initial programming of synapse weights at the beginning of a simulation, simply by writing weight values to the superconducting memory 104 of each core 100 used in a neural network. Consequently, many different kinds of networks can be mapped into core 100 or an array of such cores simply by entering weight values into rows of each memory 104. Use of a superconducting digital memory 104 in core 100 thus provides layout simplicity and setup speed advantages over neural network approaches that provide synapse weights via bias lines, and flexibility advantages over approaches that effectively hardwire their synapse weights using, e.g., selectively sized inductive couplings between superconducting loops, and thus cannot be used to simulate any neural networks other than the single neural network selected at fabrication time. The programmability feature further permits neurons simulated by core 100 to be configured to exhibit synaptic weight plasticity and thus to demonstrate Hebbian learning. Accordingly, a neural network using one or more instances of core 100 is more adaptable than non-programmable systems while still remaining much faster than software-based systems, given the superconducting speeds at which core 100 operates.

In some examples, the memory 104 is implemented as multiple memory arrays rather than as a single memory array. In some examples, the memory 104 is split into a large array and a small memory. In such examples, rows from the large array are preloaded into the small memory to provide lower latency memory accesses when processing spikes.

The digital accumulator 106 and the digital-to-analog converter 108 can together correspond to the dendritic tree 214 of the conceptual neuron 200 of FIG. 2. The digital accumulator 106 can be configured to add up the weights for each spike that is received during an action potential cycle to either intermittently (e.g., upon triggering of a latch) or continuously determine how much input has been received during the action potential cycle and thereby produce as an accumulator output a digital signal representing a numerical value. The accumulator 106 can be pipelined so that it performs digital additions as weight values become available to it from the memory 104. As an example, an OR tree (not shown) can be used to direct the correct output memory word to the input of the accumulator 116, because only one word enable 114 is high (e.g., logical "1") per spike, and all other words are low (e.g., logical "0"). In some examples, the accumulator 106 can be configured (e.g., with a latch) such that the result of the accumulator 106 is only provided to the digital-to-analog converter 108 at the end of a cycle, e.g., after a cutoff point in the action potential cycle. Thus, the accumulator result is stored and only applied to the soma 110 at a specified time. In other examples, the accumulator 106 can be configured such that result of the accumulator 106 is constantly fed to the digital-to-analog converter 108, so that the changes in current at the soma 110 correspond to the spike timing seen at the synapses. The latter configured behavior assists in the simulation of temporal coding whereas the former configured behavior can only simulate rate coding. In some examples, not illustrated, an analog circuit configured to accumulate incoming current pulses over time can be provided as an alternative for the digital accumulator 106.

The digital-to-analog converter 108 can be configured to convert the digital output of the accumulator 106 into a signal that can be provided to the soma. This signal can be a current that is proportional to the numerical value of the digital output of the accumulator 106. Thus, a larger number as a digital signal from accumulator 106 can result in a larger-amplitude output current from digital-to-analog converter 108. In examples where the value output by the accumulator 106 can change every digital cycle, then the output current of the digital-to-analog converter 108 can also change every digital cycle. Digital-to-analog converter 108 thus provides an interface between the digital logic synapse to the analog soma portions of the core. Examples of superconducting DACs are described in Paul I. Bunyk et al., *Architectural Considerations in the Design of a Superconducting Quantum Annealing Processor*, 24 IEEE TRANS. APPL. SUPERCOND., No. 4 (2014); U.S. Pat. No. 8,604,944 B2, issued Dec. 10, 2013, entitled "Systems, Methods and Apparatus for Local Programming of Quantum Processor Elements"; U.S. provisional patent application No. 60/917,884, filed May 14, 2007, entitled "Scalable Superconducting Flux Digital-to-Analog Conversion Using a Superconducting Inductor Ladder Circuit"; U.S. provisional patent application No. 60/917,891, filed May 14, 2007, entitled "Systems, Methods, and Apparatus for a Scalable Superconducting Flux Digital-to-Analog Converter"; and U.S. provisional patent application No. 60/975,487, filed Sep. 26, 2007, entitled "Systems, Methods and Apparatus for a Differential Superconducting Flux Digital-to-Analog Converter."

The analog soma circuitry 110 in neuromorphic core 100 can be provided as superconducting circuitry that uses the incoming current from digital-to-analog converter 108 to determine whether or not to emit a spike (i.e., to "fire") as an output 118 of neuromorphic core 100. The soma output can be, for example, an SFQ pulse, or multiple SFQ pulses. The analog nature of the soma circuitry 110 allows it to efficiently implement complex behaviors, such as the refractory period between spiking events, different numbers of spikes per excitation, and different spike timings. These behaviors have been observed in biological neurons and can provide additional functionality to the larger neural network when properly utilized. In contrast to the analog soma circuitry described herein, implementing these behaviors in a digital soma design would require many more circuit components, resulting in a significantly less efficient system. Soma circuitry 110 can contain circuitry for a single soma or, as discussed below with respect to FIGS. 5 and 6, can contain an array of soma circuits to enable a single core 100 to represent multiple neurons, e.g., a plurality of neurons in different layers of a neural network, such as neural network 300 in FIG. 3.

Preservation of the timing relationship between incoming spikes and when the corresponding current is applied to the soma 110 enables temporal coding and more complex neuron behaviors where the timing of inputs, not just the magnitude, affect the state of the soma 110. Clear separation of layers in a software model of the network enables the neuromorphic core controller (i.e., the aforementioned state machine control circuitry) to know which synapse weights to use. In examples where layers are used, an additional buffer (not shown) can be configured to store spikes from the current layer so as not to apply them until the next layer is computed when the system cycle advances. The spikes can then be replayed out of the buffer.

In a network of multiple instances of core 100, the cores can be connected together, either directly as shown in FIG. 9, or by a digital signal distribution network configured to distribute and deliver spikes between the cores, as shown in FIG. 10. The digital network enables use the cores to build a large-scale neural network in hardware incorporating potentially hundreds of thousands or millions of neurons on a single chip. Such a network is not part of the core 100. A state machine control circuit (not shown) can be used to determine which spikes to buffer and which memory addresses to read from to get the weights for the appropriate layer in the neural network model. A single state machine control circuit can also be used to coordinate the operation of multiple cores in a network of cores such as the networks of FIGS. 9 and 10. Accordingly, this state machine control circuit is separate from the neuromorphic core 100. In some examples, a single state machine control circuit can use one or more clocks to generate the control signals required by the components of a single neuromorphic core 100. In other examples a single state machine control circuit can be used to simultaneously control multiple neuromorphic cores.

Figure 5:
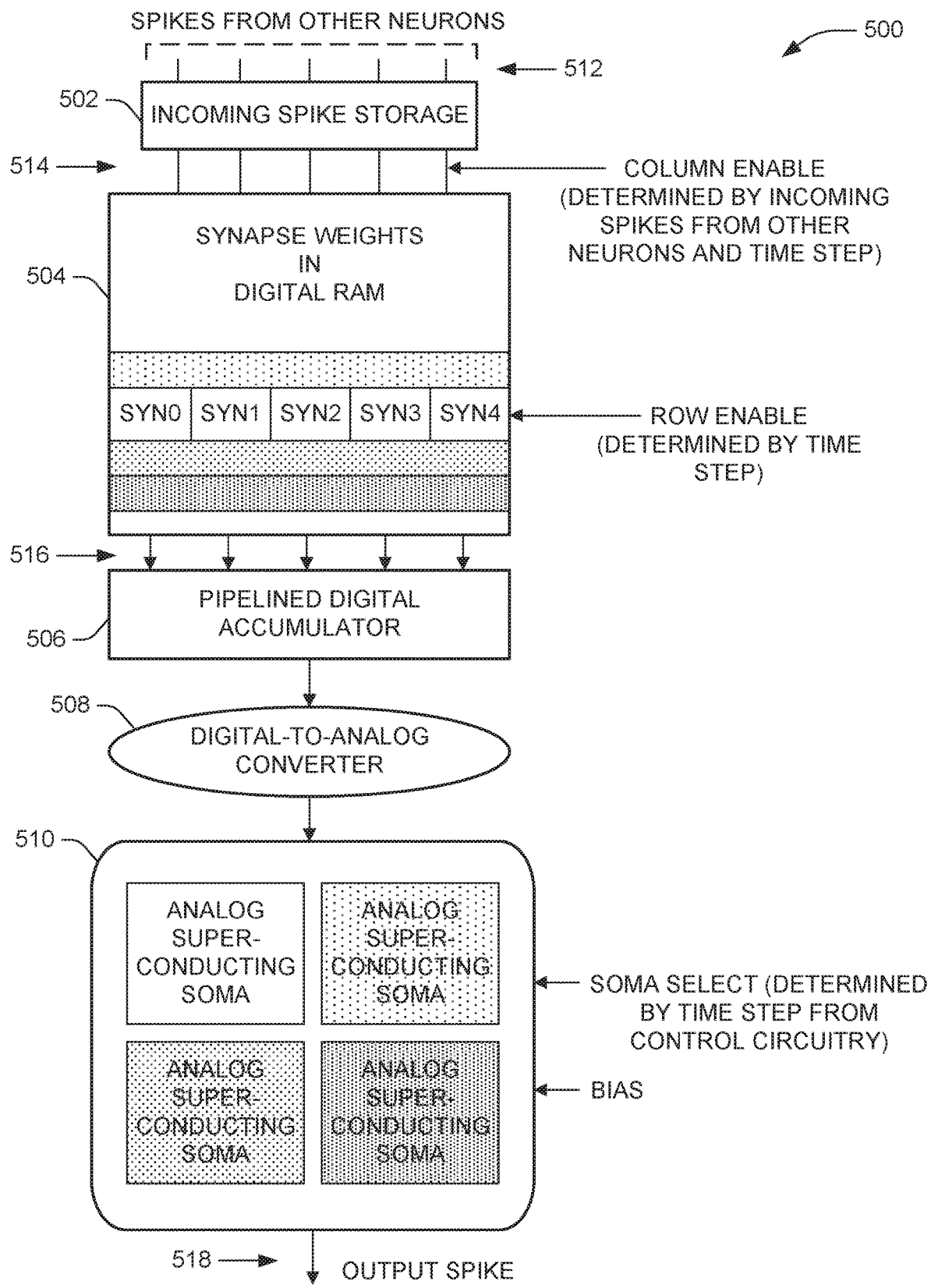
FIG. 5 is a block diagram of an example neuromorphic core.

FIG. 5 illustrates a neuromorphic core 500 having a soma array 510 that includes multiple soma circuits so as to represent multiple independently addressable neural cell bodies. Each soma circuit in the array 510 can, for example, have a different output threshold function, and can maintain a separate state. The threshold function of each soma can be linear or nonlinear. Example core 500 is illustrated as having four soma circuits in its array 510, but can have greater or fewer soma in other examples. These different soma circuits are "color-coded" with stipple-shading in the illustration of FIG. 5. Corresponding color-coding marks rows in memory array 504. Thus, as the row enable (provided, for example, by a state machine control circuitry, as discussed above) activates the memory rows in sequence, one row after another, to simulate one neuron after another, each soma circuit in array 510 can be addressed sequentially and the output of digital-to-analog converter 508 can be provided to the corresponding soma in the array. Consequently, one core 500 can represent multiple neurons not only having different synapse weights (in memory array 504) but also having different soma activation thresholds (by providing separate soma circuits in soma array 510). In other examples, the different soma circuits in soma array 510 can each have different circuit structure so as to permit simulation, in a single core, of varying types of biological neurons having different soma response properties, or with varying degrees of biological verisimilitude by permitting the selection within the core of the soma circuit most suited to the response desired by the particular application of the neural network. The remaining elements 502, 506, 512, 514, 516, 518 of core 500 can be similar to their similarly-numbered counterparts in FIG. 1 and can function equivalently thereto.

Figure 6:
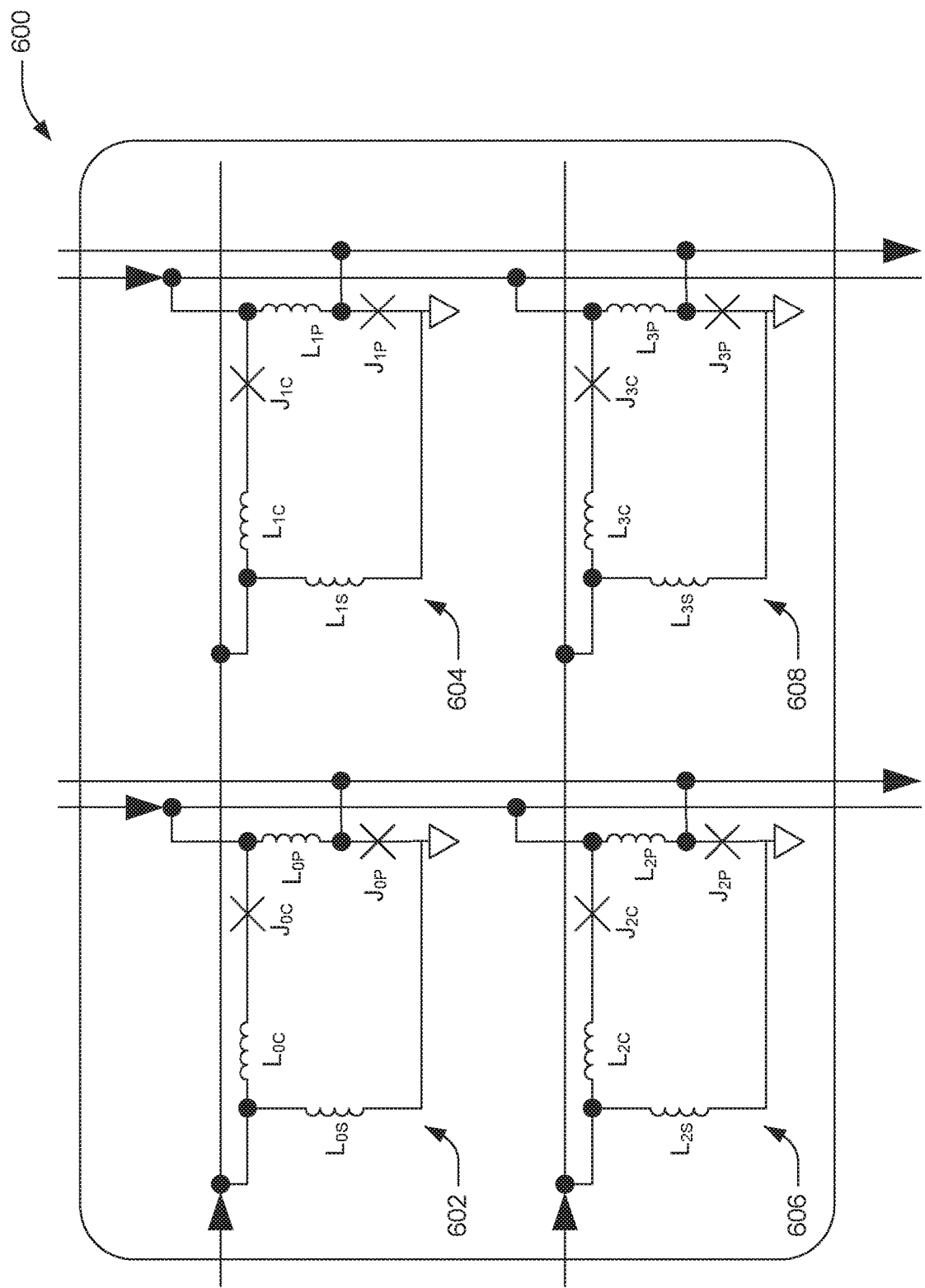
FIG. 6 is a circuit diagram of an example soma array used in a neuromorphic core.

FIG. 6 shows an example soma array 600 that can correspond to soma array 510 of FIG. 5. Each soma circuit 602, 604, 606, 608 represents a compact soma (neuron body) circuit design with biologically-realistic operation. In the illustrated example, each soma circuit 602, 604, 606, 608 includes just two Josephson junctions and just three inductors, instead of, for example, tens, hundreds, or thousands of components, as may be required of other designs, such as designs that attempt to digitally emulate neuron operation. Other, more complex but potentially more biologically suggestive soma designs may also be used in soma array 510 of core 500, and, as discussed above, a greater or lesser number of individually addressable soma circuits can be used in the array 600. Each soma circuit 602, 604, 606, 608 can, for example, be provided with different biasing of its components so as to have a distinct threshold function determinative of whether accumulated input weights result in the generation of an output spike or not. Also, as discussed above, each addressable soma circuit in the array can have a different structure so as to provide a core with somas of different advantageous features or behaviors, e.g., as may result from different biological suggestiveness, and the ability to select therebetween.

Figure 7:
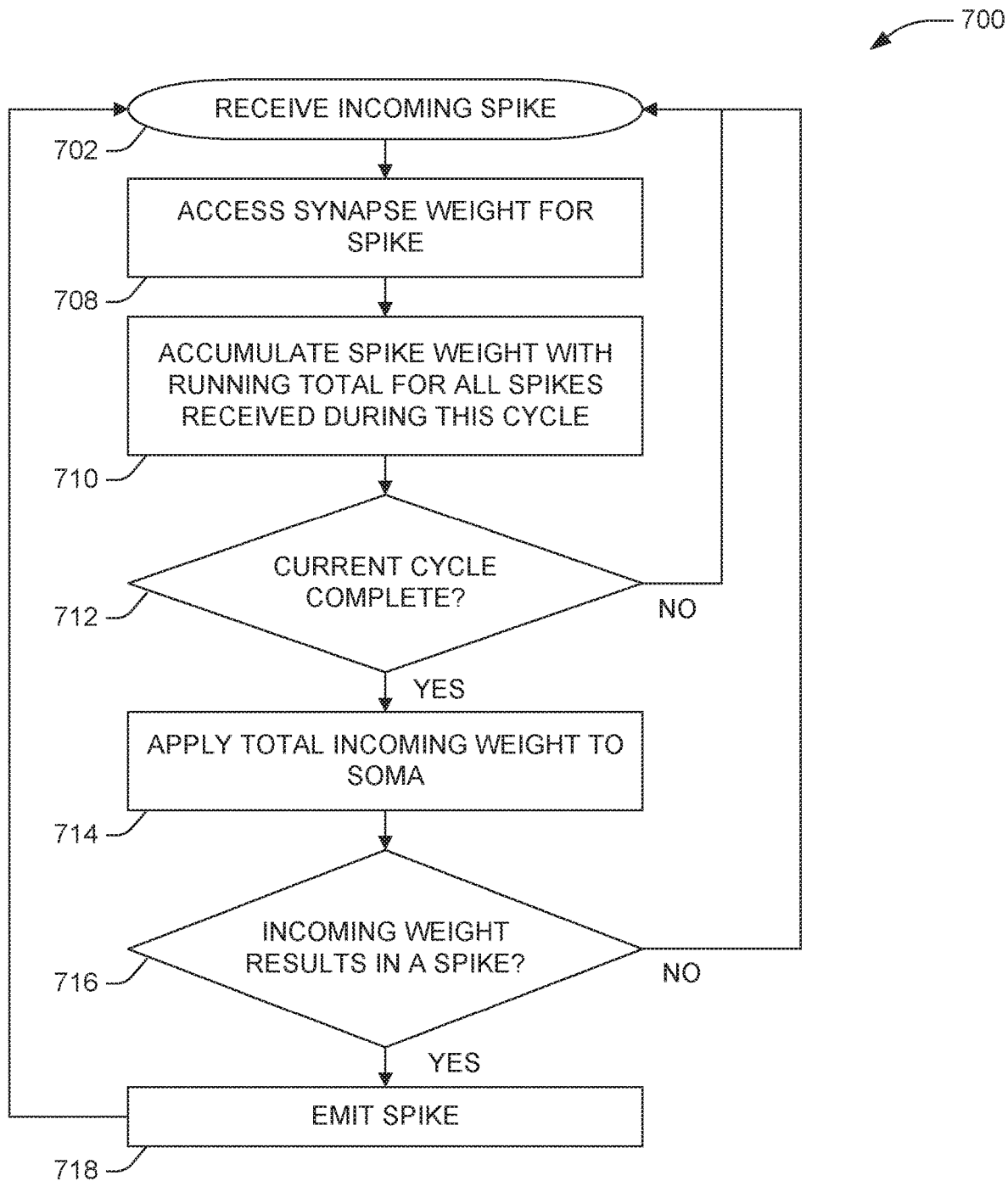
FIG. 7 is a flow diagram illustrating the operation of a neuromorphic core without a spike buffer, or configured not to hold spikes in a spike buffer, and configured to apply an accumulated weight to a soma only when the accumulation is complete.

FIG. 7 illustrates functioning 700 of a neuromorphic core like cores 100 or 500 of FIG. 1 or 5 when the core either omits a spike buffer or when the spike buffer passes an incoming spike directly through to the memory on a corresponding one of the memory's column select lines, and when accumulated weight is applied to a soma only after the accumulation is complete. Upon receipt 702 of an incoming spike, the stored synapse weight for the spike is accessed 708, e.g., based upon the receipt of the spike and the particular time cycle of operation of the core. The accessed spike weight is accumulated together 710 with a running total of accessed weights for all spikes received during the same cycle. This process 702, 708, 710 repeats 712 so long as the cycle is not complete. When the cycle is complete, the cycle's total accumulated incoming weight is applied 714 to the soma of the neuromorphic core, where the accumulated weight is compared to a threshold to determine 716 whether the simulated neuron should fire or not. If not, a new cycle is begun. If so, a spike (e.g., an SFQ pulse) is emitted 718. As an example, a cycle can be considered to be "complete"

for the purposes of process 700 and its determination 712 after a predetermined spike input cutoff time during the cycle, after which no further received input spikes will impact the firing of the neuron being simulated by the neuromorphic core in that cycle. Such a cutoff time can be set, for example, by control inputs to the neuromorphic core provided by state machine control circuitry, as discussed above.

Figure 8:
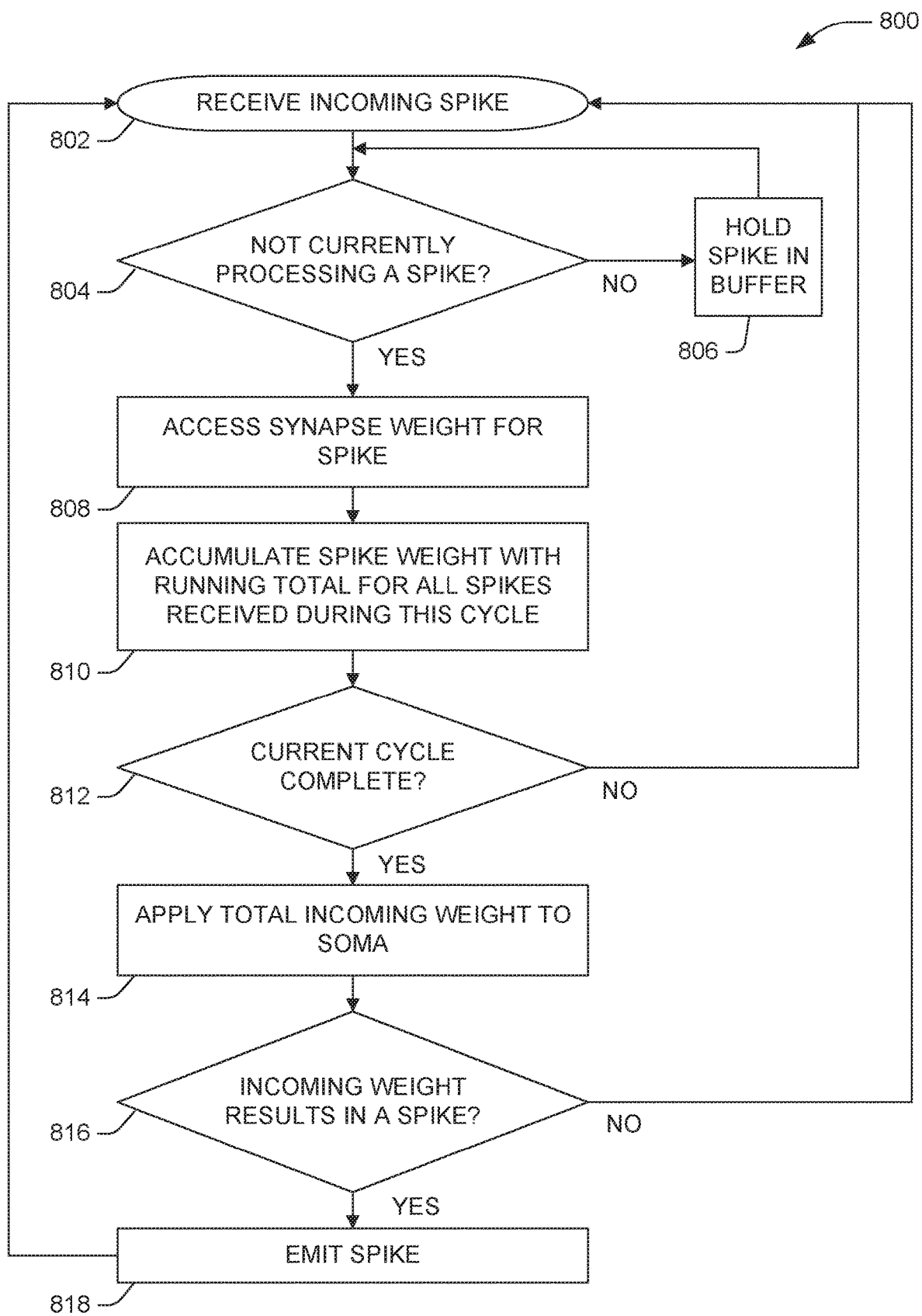
FIG. 8 is a flow diagram illustrating the operation of a neuromorphic core with a spike buffer, and configured to apply an accumulated weight to a soma only when the accumulation is complete.

FIG. 8 illustrates functioning 800 of a neuromorphic core like cores 100 or 500 of FIG. 1 or 5 when the core includes a spike buffer, such as buffer 102 or 502, and when accumulated weight is applied to a soma only after the accumulation is complete. Actions 802, 808, 810, 812, 814, 816, and 818 are identical to their similarly-numbered counterparts in FIG. 7, except that after receipt of an incoming spike 802, the synapse weight is only accessed 808 if the core is not already currently processing a spike, e.g., by performing a memory retrieval function (which may have some time delay associated with it) or by performing any other part of the activation simulation computation which requires only one spike at a time to be processed. If the core is busy 804 processing a spike, as may be determined, for example, by a signal from the core's weight-storing memory array or any other part of the core, then the incoming spike is held 806 in the core's incoming spike buffer until it is ready to be processed. Buffer-stored spikes can be processed one at a time by sequential release from the buffer into the memory as the memory becomes available for read use. As an example, a cycle can be considered to be "complete" for the purposes of process 800 and its determination 812 after a predetermined spike input cutoff time during the cycle, after which no further received input spikes will impact the firing of the neuron being simulated by the neuromorphic core in that cycle. Such a cutoff time can be set, for example, by control inputs to the neuromorphic core provided by state machine control circuitry, as discussed above.

FIG. 9 illustrates functioning 900 of a neuromorphic core like cores 100 or 500 of FIG. 1 or 5 when the core either omits a spike buffer or when the spike buffer passes an incoming spike directly through to the memory on a corresponding one of the memory's column select lines. Upon receipt 902 of an incoming spike, the stored synapse weight for the spike is accessed 908, e.g., based upon the receipt of the spike and the particular time cycle of operation of the core. The accessed spike weight is accumulated together 910 with a running total of accessed weights for all spikes received during the same cycle. Continuously during a cycle, the cycle's total accumulated incoming weight is applied 914 to the soma of the neuromorphic core, where the accumulated weight is, for example, compared to a threshold to determine 916 whether the simulated neuron should fire or not. If so, a spike (e.g., an SFQ pulse) is emitted 918. If not, or after the spike is emitted, the process 900 returns to an idle state 920 to await another incoming spike.

FIG. 10 illustrates functioning 1000 of a neuromorphic core like cores 100 or 500 of FIG. 1 or 5 when the core includes a spike buffer, such as buffer 102 or 502. Actions 1002, 1008, 1010, 1014, 1016, 1018, and 1020 are identical to their similarly-numbered counterparts in FIGS. 7 and 9, except that after receipt 1002 of an incoming spike, the synapse weight is only accessed 1008 if the core is not already currently processing a spike, e.g., by performing a memory retrieval function (which may have some time delay associated with it) or by performing any other part of the activation simulation computation which requires only one spike at a time to be processed. If the core is busy 1004 processing a spike, as may be determined, for example, by a signal from the core's weight-storing memory array or any other part of the core, then the incoming spike is held 1006 in the core's incoming spike buffer until it is ready to be processed. Buffer-stored spikes can be processed one at a time by sequential release from the buffer into the memory as the memory becomes available for read use.

Figure 11:
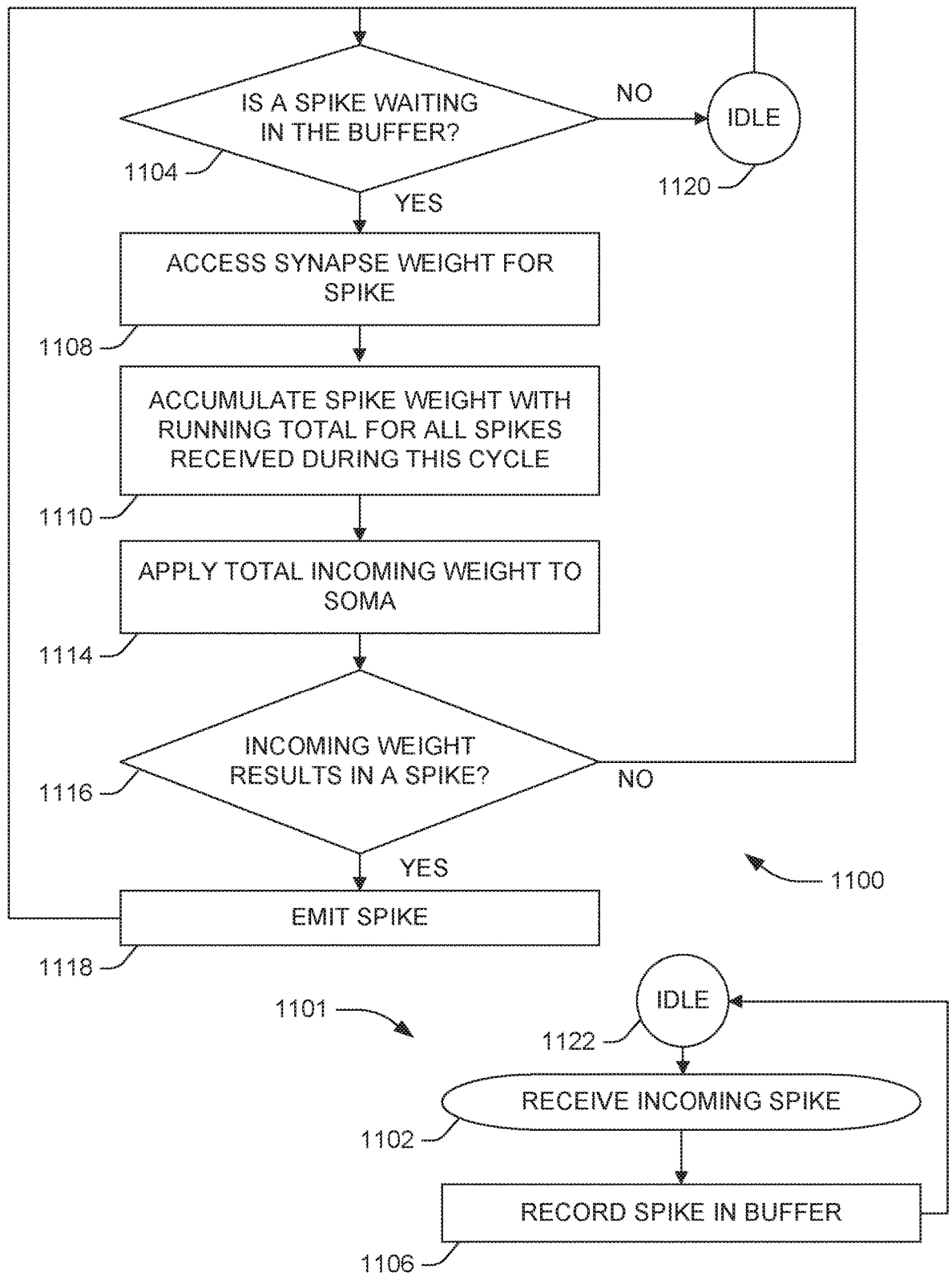
FIG. 11 is a flow diagram illustrating the operation of a neuromorphic core with a spike buffer, and configured to apply accumulated weight to a soma continuously, and wherein the buffer control operates on a different loop from the pipeline control.

FIG. 11 illustrates, as two parallel processes 1100, 1101, the functioning of a neuromorphic core like cores 100 or 500 of FIG. 1 or 5 when the core includes a spike buffer, such as buffer 102 or 502. In process 1100, when a spike is waiting 1104 in the buffer, the stored synapse weight for the spike is accessed 1108, e.g., based upon the receipt of the spike and the particular time cycle of operation of the core. The accessed spike weight is accumulated together 1110 with a running total of accessed weights for all spikes received during the same cycle. Continuously during a cycle, the cycle's total accumulated incoming weight is applied 1114 to the soma of the neuromorphic core, where the accumulated weight is, for example, compared to a threshold to determine 1116 whether the simulated neuron should fire or not. If so, a spike (e.g., an SFQ pulse) is emitted 1118. If not, or after the spike is emitted, the process 1100 returns to check 1104 whether another spike is waiting in the buffer. Whenever this check 1104 finds that no spike is waiting in the buffer, the process goes to an idle state 1120 until a spike is in the buffer. In process 1101, upon receipt 1102 of an incoming spike, the spike is recorded 1106 in the spike buffer, and the process 1101 returns to an idle state 1122 until another spike is received. Accordingly, actions 1102, 1106, 1108, 1110, 1114, 1116, and 1118 are identical to their similarly-numbered counterparts in FIGS. 7-10, but the arrangement of the actions into different parallel processes differs from processes 700, 800, 900, and 1000.

In the processes 900, 1000, and 1100 of FIGS. 9, 10, and 11, accumulated weight is applied to the soma continuously. This is in contrast to the methods 700 and 800 of FIGS. 7 and 8, wherein accumulated weight is applied to the soma only after all receipt of all incoming weight during a system cycle (e.g., from spikes arriving prior to a cutoff time in the system cycle). Accordingly, with the appropriate choice of soma circuitry, processes 900, 1000, and 1100 may be capable of simulating temporal coding by preserving in the soma presentation the timing relationships between incoming pulses or incoming spike trains, whereas processes 700 and 800 may only be capable of simulating rate coding given the fact that these processes single-time soma presentation effectively destroys the timing relationship between pulses. In some applications, the ability to simulate temporal coding may be preferred over the ability to simulate only rate coding for its potentially enhanced biological suggestivity.

Figure 12:
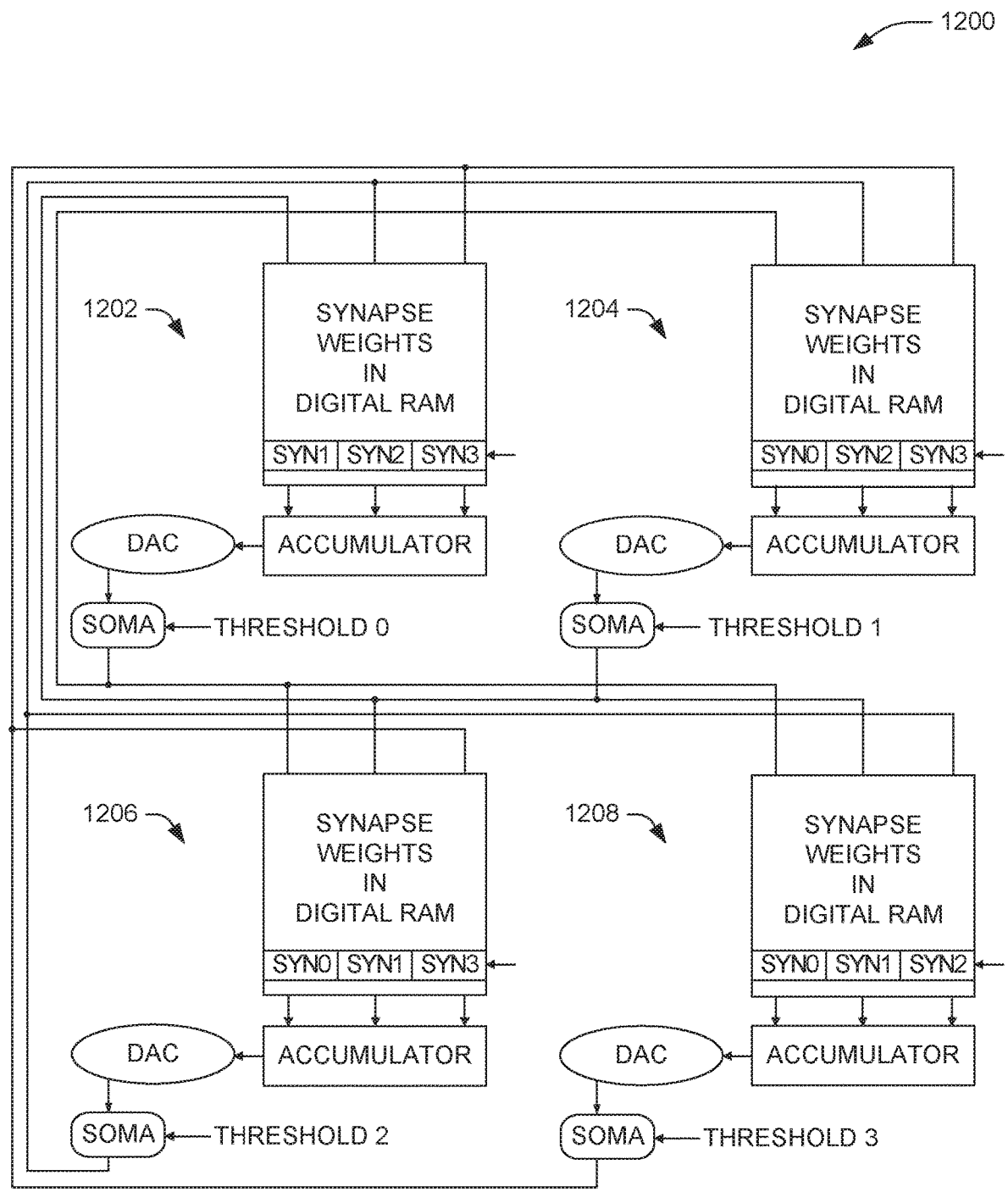
FIG. 12 is a block diagram illustrating the direct network of four neuromorphic cores together to create a neural network of four neurons in each layer, as in the hidden layers of the example network shown in FIG. 3.

FIG. 12 shows an example network 1200 of neuromorphic cores 1202, 1204, 1206, 1208 that are connected together directly. As illustrated, each core receives as input the output of each of the three other cores, i.e., each column input into a memory array of one core corresponds to a soma output from another core. Accordingly, each of the somas maps into a column in the other neurons' synapse weight arrays. Recalling that a memory column and row determine a particular synapse connection between a computed neuron and a presynaptic neuron, it can be understood that when the cores 1202, 1204, 1206, 1208 each advance to compute the next layer in a neural network, each one incorporates as input the activation results from the neurons represented by the other cores in the previous time step. Other examples can include to include more or fewer cores than four (as illustrated), or cores connected to themselves to receive their own outputs as inputs. Connecting the soma output of a core to an input of the same core creates a recurrent neural network connection. Further time multiplexing can be used to re-use cores for multiple neurons in the same layer. Such an approach uses multiple time steps per layer rather than one time step per layer.

Figure 13:
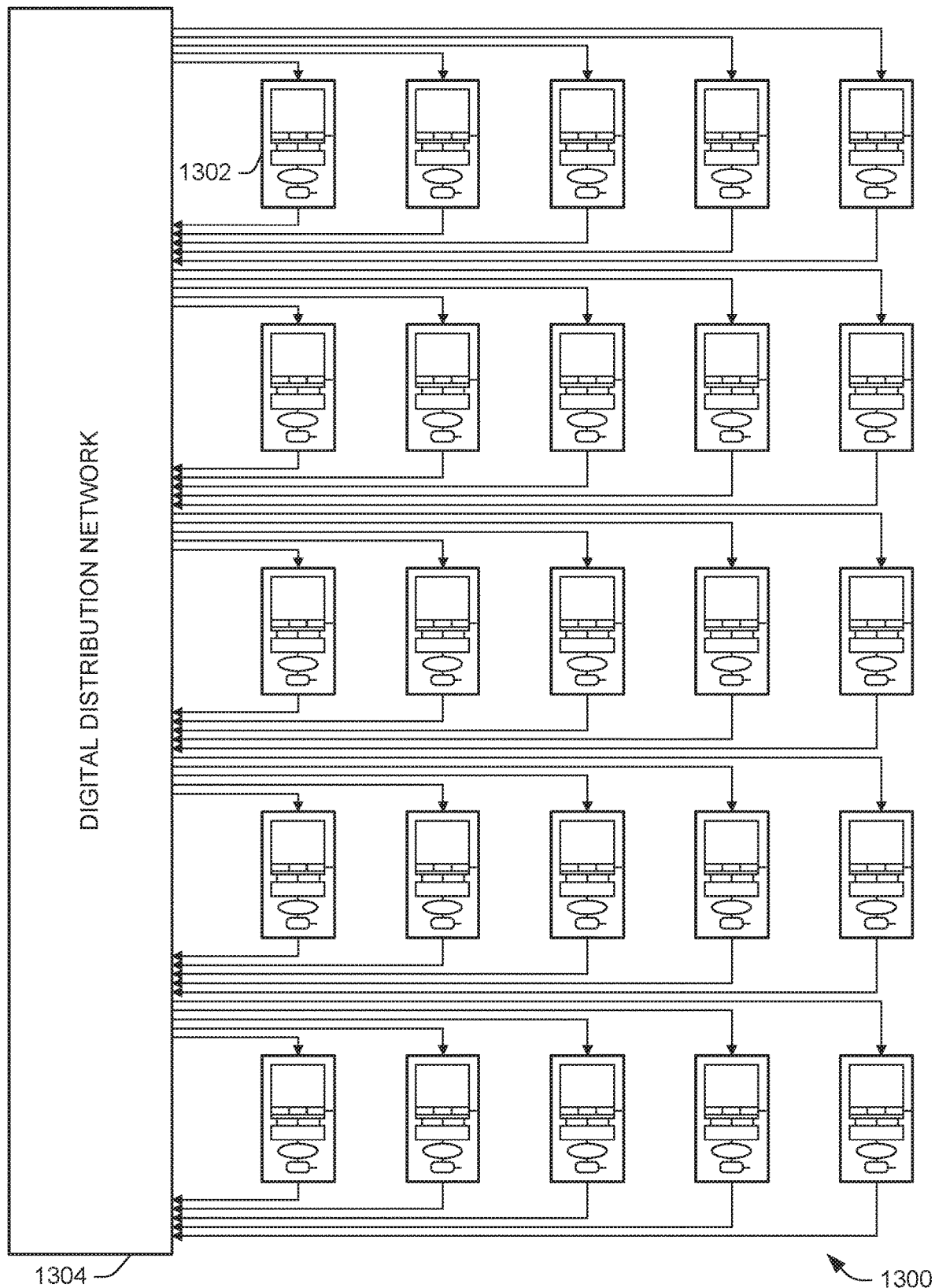
FIG. 13 is a block diagram illustrating networking of numerous neuromorphic cores together via a digital distribution network to create a large-scale neural network.

FIG. 13 shows another example network 1300 of neuromorphic cores 1302, each of which can correspond, for example to core 100 in FIG. 1 or core 500 in FIG. 5. Rather than being directly connected together as in FIG. 12, the connections to and from each core 1302 are handled by a superconducting digital distribution network 1304. Twenty-five cores are illustrated in the example network 1300, but other example networks can have more or fewer cores. The arrangement of FIG. 13 permits numerous cores to be connected so as to simulate, in hardware and at superconducting speeds, neural networks of thousands, hundreds of thousands, or millions of neurons on a single chip or on multiple connected chips.

Two different examples of operational timing of a neuromorphic core are provided here. In the first example, illustrated in the timing diagram of FIGS. 14A and 14B, pipeline latency is not accounted for because timing between input pulses is not preserved. In the second example, illustrated in the timing diagram of FIGS. 15A through 15E, pipeline latency is accounted for, as described below with respect to FIGS. 15A through 15E. The timing regime depicted in the example of FIGS. 14A and 14B can correspond, for example, to use of a neuromorphic core in accordance with processes 700 or 800 of FIG. 7 or 8. The timing regime depicted in the example of FIGS. 15A-15E, by contrast, can correspond, for example, to use of a neuromorphic core in accordance with processes 900, 1000, or 1100, as shown in FIGS. 9, 10, and 11.

Figure 14A:
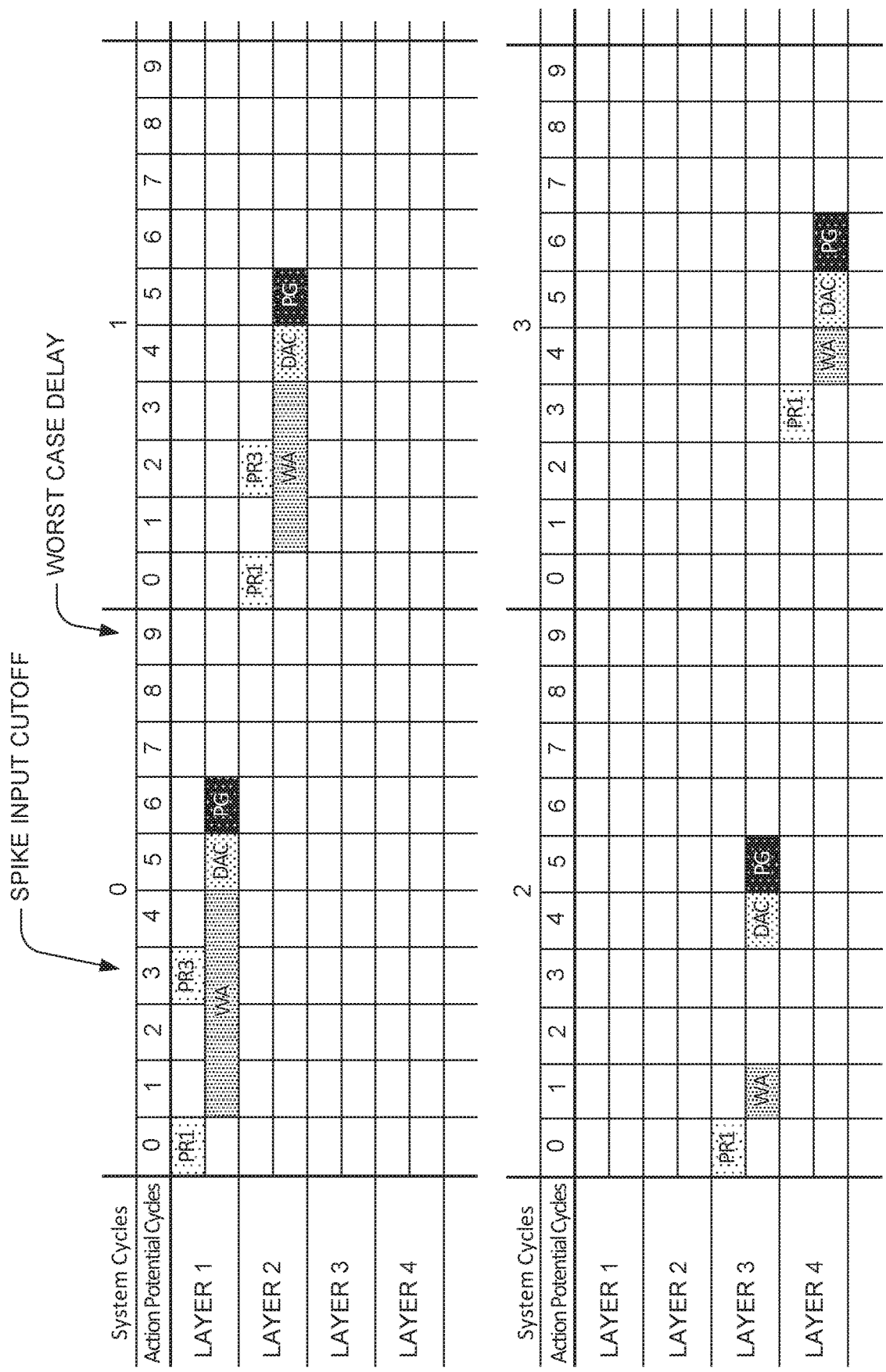
FIGS. 14A and 14B are a timing diagram illustrating an example of pipelined operation of a neuromorphic core.
Figure 14B:
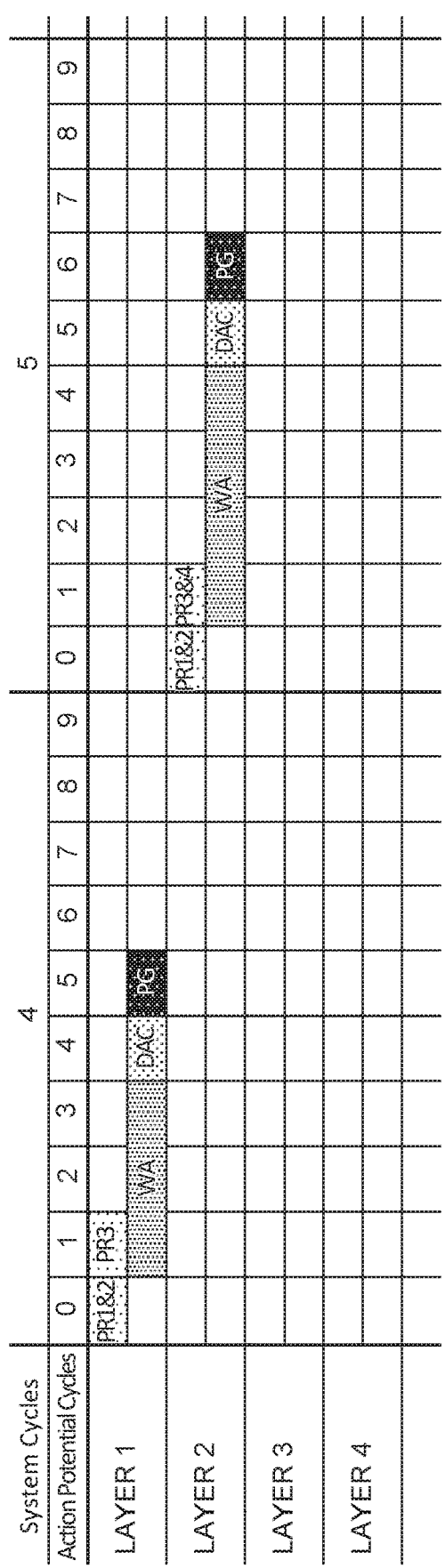
Figure 14B:
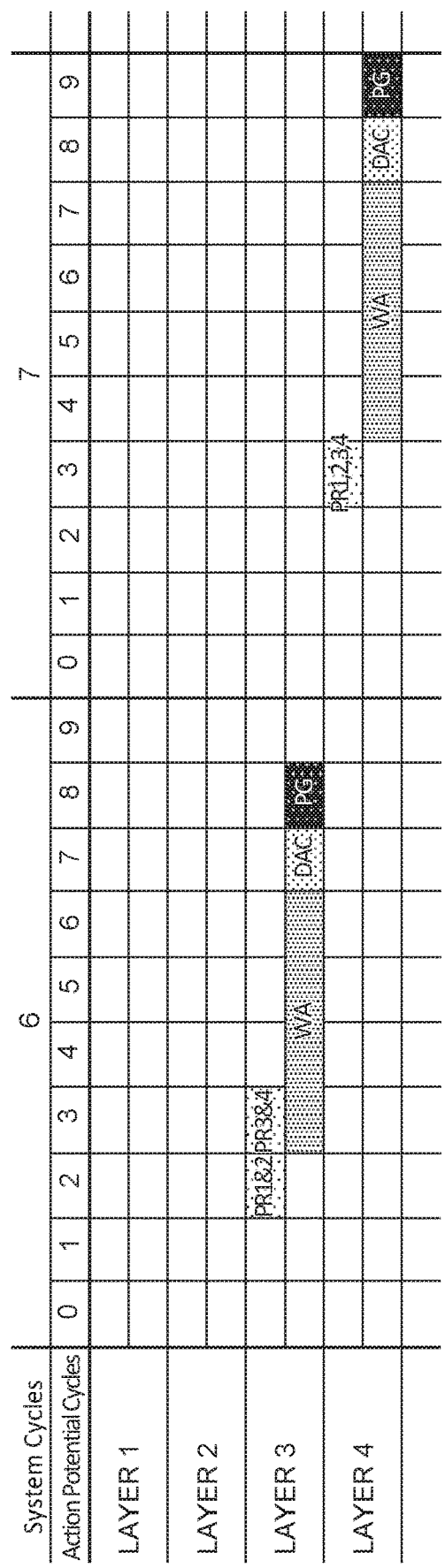

FIGS. 14A and 14B show a timing diagram describing the timing of an example functioning of a neuromorphic core, such as core 100 or core 500, when the core is configured to simulate four neurons each in a respective successive layer of a neural network. The timing regime depicted by these drawings can be used, for example, when a neuromorphic core operates according to the processes 700 or 800 shown in FIG. 7 or 8, respectively, wherein accumulated weight is applied to a soma only after the accumulation is complete. Along the horizontal scale (i.e., the time scale), the timing diagram is divided into eight system cycles (numbered zero through seven) each consisting of ten action potential cycles (numbered zero through nine). Action potential cycle cells in the timing diagram labeled "PR" indicate that an action potential is received during the action potential cycle and that a memory access is subsequently performed during said action potential cycle. Action potential cycle cells in the timing diagram labeled "WA" indicate that a weight accumulation is performed during the respective action potential cycle. Action potential cycle cells in the timing diagram labeled "DAC" indicate that digital-to-analog conversion (i.e., weight modulation) is performed during the respective action potential cycle. Action potential cycle cells in the timing diagram labeled "PG" indicate that action potential generation is performed (i.e., to emit an output spike from a soma of a core) during the respective action potential cycle.

The length of time of each action potential cycle is determined, for example, by the access time of the core's memory, i.e., the amount of time it takes to process an incoming action potential spike to prepare it for pipelined accumulation. So as to guarantee a maximum allowable delay of each neuron, labeled in the diagram as "worst case delay" and corresponding in the illustrated example to the tenth action potential cycle of any particular system cycle, a spike input cutoff can be established, such that any spikes received by the core after the spike input cutoff are disregarded (i.e., not processed by the neural simulation performed by the neuromorphic core). In the illustrated example, the spike input cutoff comes after the fourth of ten action potential cycles in each system cycle.

In the example illustrated in FIGS. 14A and 14B, in system cycle 0 of the neuromorphic core, during which a first neuron of the neuromorphic core is simulated (e.g., a neuron in a first neural network layer), a first action potential of the system cycle is received on a first action potential input line during action potential cycle 0. The corresponding weight for the synapse on which the action potential is received (i.e., corresponding to a particular memory column select line) is selected and retrieved from the core's local memory, during the same action potential cycle, in accordance with the memory column select line on which the action potential is received and the memory row select line which effectively designates that a neuron in layer 1 is presently simulated and chooses the row in the memory storing the synapse weights associated with that neuron.

Accordingly, weight accumulation (e.g., by digital accumulator 106 or 506) begins in the next action potential cycle, i.e., action potential cycle 1 of system cycle 0, and continues until all action potentials received before the cutoff have been sequentially processed with corresponding weight-retrieval memory accesses by the neuromorphic core. A second action potential of system cycle 0 is received on a third action potential input line during action potential cycle 3, just before the cutoff. The corresponding weight is retrieved from the memory in action potential cycle 3 and said weight is accumulated (i.e., summed with earlier-accumulated weight from the first received action potential of system cycle 0) during action potential cycle 4. All pre-cutoff received action potential synapse weights having been accumulated, the corresponding digital value is converted to an analog current (e.g., by DAC 108 or 508) in action potential cycle 5 and an output action potential is generated, or not, depending on whether the weight exceeds the threshold of a corresponding layer 1 soma, in action potential cycle 6 of system cycle 0, thus completing the neuromorphic core's simulation of the neuron in layer 1.

The neuromorphic core then moves on to simulation of a succeeding layer 2 neuron in the next system cycle, system cycle 1, in part by advancing of the value in the core's memory's row select line to point to the next row of the memory, or to whatever row in the memory corresponds to the layer 2 neuron simulated by the core (there being no strict requirement that weights for successively simulated neurons be stored in successive memory rows). In the illustrated example, a first action potential arrives on the first action potential input line in the first action potential cycle of the system cycle, i.e., action potential cycle 0. The corresponding synapse weight is retrieved from the memory and, again, accumulation begins in the next action potential cycle, action potential cycle 1. A second action potential of system cycle 1 is received on a third action potential input line during action potential cycle 2, which is, again, prior to the cutoff designed into the core. The corresponding weight is retrieved from the memory in action potential cycle 2 and said weight is accumulated during action potential cycle 3. No action potentials having been received during action potential cycle 3 (i.e., before the cutoff), the digital-to-analog conversion of the accumulated synapse weights can take place immediately in action potential cycle 4, rather than in action potential cycle 5, as was the case in system cycle 0. An output action potential is generated, or not, in action potential cycle 5 of system cycle 1, and the core timely moves on to simulation of the neuron in layer 3 after several more uneventful action potential cycles.

Now in system cycle 2, a first action potential is received on the first action potential input line in the first action potential cycle of the system cycle, i.e., action potential cycle 0, and no further action potentials are received thereafter in the same system cycle. Even though accumulation completes in action potential cycle 1, the core waits until action potential cycle 4, after it can be determined that no more action potentials arrive before the cutoff at the end of action potential cycle 3, to begin digital-to-analog conversion in action potential cycle 4 and soma thresholding for spike generation (or not) in action potential cycle 5.

System cycle 3 moves on to the fourth neuron simulated by the core in the illustrated example, and shows a first action potential arriving on the first action potential input line just before the spike input cutoff in the fourth action potential cycle of the system cycle, i.e., action potential cycle 3. Accumulation begins and ends in the next action potential cycle, action potential cycle 4, with digital-to-analog conversion of the accumulated synapse weights and output spike propagation (or not) occurring in subsequent action potential cycles 5 and 6, respectively.

Although the neuromorphic cores described herein can sequentially simulate an arbitrarily large number of neurons, the example of FIGS. 14A and 14B involve a four-neuron core, and thus in system cycle 4, the core returns to simulating its layer 1 neuron. Two input spikes arrive on first and second synapses in action potential cycle 0 of system cycle 4, and because the weights for each are retrieved from the core's memory sequentially, the spikes may be buffered until the memory is available. Accordingly, when a third spike arrives on the third synapse in the next action potential cycle, i.e., action potential cycle 1 of system cycle 4, its weight is not retrieved in action potential cycle 1, but instead in action potential cycle 2, because the memory is busy retrieving the weight corresponding to the 2nd-synapse action potential during action potential cycle 1. Thus, it is not until the end of action potential cycle 3 that all weights are assuredly accumulated, and digital-to-analog conversion and soma processing can take place in subsequent action potential cycles 4 and 5, respectively. After a few more uneventful action potential cycles, system cycle 4 is complete and the layer 2 neuron is again simulated by the core.

In the example of system cycle 5, two action potentials arrive on their respective synapses during each of action potential cycles 0 and 1. Each input spike is buffered to wait its turn until the memory is free to process it by retrieving the associated weight. As such, it takes four action potential cycles, 1, 2, 3, and 4, until accumulation is assuredly complete in system cycle 5. The DAC and soma processing occur subsequently in action potential cycles 5 and 6, respectively.

In the example of system cycle 6, processing a layer 3 neuron, two action potentials arrive on their respective synapses during each of action potential cycles 2 and 3. They are all still timely, so again, each input spike is buffered to wait its turn until the memory is free to process it by retrieving a corresponding weight from memory. As such, it takes four action potential cycles, 3, 4, 5, and 6, until accumulation is assuredly complete in system cycle 6. The DAC and soma processing occur subsequently in action potential cycles 7 and 8, respectively.

System cycle 7, during which a layer 4 neuron is again simulated, shows what happens when four input spikes all arrive just before the spike input cutoff, here in action potential cycle 3. Each spike is buffered and accumulation begins not until action potential cycle 4 and ends not until action potential cycle 7, providing one memory lookup action potential cycle for each timely input spike despite the fact that they may have all arrived contemporaneously in action potential cycle 3. Accordingly, DAC processing cannot occur until the penultimate action potential cycle of the system cycle, action potential cycle 8, and soma processing occurs in the tenth and final action potential cycle of the system cycle, action potential cycle 9. Had the spike input cutoff been designed to be any later in the examples illustrated, ten action potential cycles per system cycle may not have been sufficient to timely process all incoming spikes prior to the advent of the next system cycle.

The preceding example of FIGS. 14A and 14B involves a number of action potential cycles per system cycle and spike input cutoff tailored to the maximum number of synapses of the neurons simulated by the core. As stated previously, cycle timing can be coordinated by state machine circuitry. The state machine control circuitry coordinating cores having a larger number of synapses (i.e., a larger number of spike input lines and, correspondingly, memory columns) may be configured to provide cores with a greater number of action potential cycles per system cycle to ensure that all timely arriving input spikes can be processed before the end of the system cycle, while still providing a wide enough time berth for previous-system-cycle spike arrival via an appropriate spike input cutoff (e.g., one lasting at least three to four action potential cycles, although this precise number may vary based on system size and timing requirements).

The example of FIGS. 14A-14B involves a number of action potential cycles per system cycle and a spike input cutoff tailored to the maximum number of synapses of the neurons simulated by the core. As stated previously, cycle timing can be coordinated by state machine circuitry. The state machine control circuitry coordinating cores having a larger number of synapses (i.e., a larger number of spike input lines and, correspondingly, memory columns) may be configured to provide cores with a greater number of action potential cycles per system cycle to ensure that all timely arriving input spikes can be processed before the end of the system cycle, while still providing a wide enough time berth for previous-system-cycle spike arrival via an appropriate spike input cutoff (e.g., one lasting at least three to four action potential cycles, although this precise number may vary based on system size and timing requirements).

In the timing diagram of FIGS. 14A and 14B, inputs to a neuron in a system cycle cause the neuron to fire (or not to fire) within the same system cycle. The resultant outputs of one layer affect the next layer in a subsequent system cycle. It may thus be observed that in a neural network organized along layers, as with the example network 300 illustrated in FIG. 3, it is necessary to wait until a next system cycle to process the resultant output of a present system cycle. This timing regime works to properly represent rate-coded neural processing so long as output spikes are emitted after the spike input cutoff (i.e., after action potential cycle 4 in the example of FIGS. 14A and 14B) and can be appropriately buffered at the input of a next-layer neuron. However, because accumulated weights are presented to the soma all at once in the timing regime illustrated in FIGS. 14A and 14B, this timing regime does not preserve the timing relationships between incoming spikes and thus does not enable simulation of temporally coded neural network systems. Accordingly, FIGS. 15A through 15E show a timing diagram describing the timing of another example functioning of a neuromorphic core, such as core 100 or core 500. As with the previous example of FIGS. 14A and 14B, the core is configured to simulate four neurons each in a respective successive layer of a neural network, but unlike with the previous example, spikes incoming in one system cycle are applied to a neuron simulated by the neuromorphic core in an immediately subsequent system cycle.

The timing regime illustrated in FIGS. 15A through 15E further represents an improved operation over that described above with respect to FIGS. 14A and 14B, as follows. Because it may take a number of digital cycles for a weight to be accessed from memory, accumulated by the digital accumulator, and applied to the soma, there may elapse several such digital cycles at the start of each action potential clock cycle before a first spike can be possibly generated. Thus, for example, even if an extremely weighted incoming spike occurs on the first digital cycle of an action potential cycle, the resulting output spike is not generated until after multiple digital cycles have elapsed. To hide this latency, the spike buffer can be shifted back in time by the latency of the pipeline. For example, if it takes three digital cycles for an incoming action potential to move through the pipeline of a neuromorphic core (i.e., from top to bottom of the diagram of FIG. 1 or that of FIG. 5), then a corresponding spike that is generated on the third digital cycle can be recorded in the buffer as occurring on cycle zero. In addition, at least three digital cycles can be added to the action potential clock period to allow time for the last spike to propagate through the pipeline.

Accordingly, the timing diagram of FIGS. 15A-15E is divided into five system cycles (numbered 0 through 4), each consisting of two action potential cycles (numbered 0 through 1). Each action potential cycle in the illustrated example is further divided into eight logic clock cycles, labeled 0 through 5, X, and Y. In such an example, a FIFO input buffer in a neuromorphic core could have sixteen entries, but no entries would be pushed out during the X and Y cycles. Logic clock cycle cells in the timing diagram labeled "PR" indicate that an action potential is received during the logic clock cycle and that a corresponding memory access is subsequently performed during the next system potential cycle, as indicated by logic clock cycle cells in the timing diagram labeled "PA." Logic clock cycle cells in the timing diagram labeled "WA" indicate that a weight accumulation is performed during the respective logic clock cycle. No logic clock cycle cells are devoted to digital-to-analog conversion (i.e., weight modulation) because in the timing example of FIGS. 15A-15E this conversion is performed continuously. Logic clock cycle cells in the timing diagram labeled "PG" indicate that action potential generation is performed (i.e., to emit an output spike from a soma of a core) during the respective logic clock cycle.

Figure 15A:
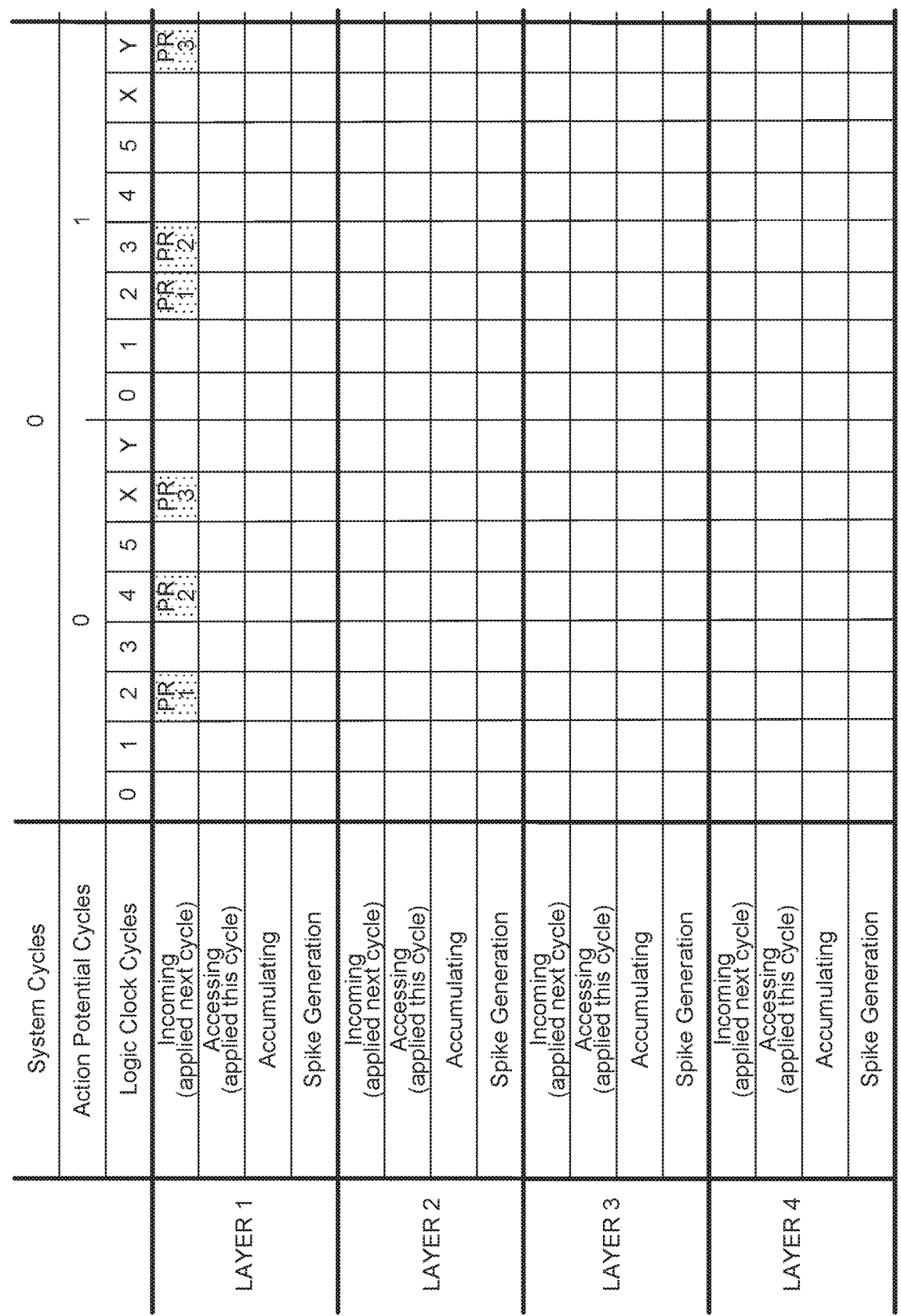

In system cycle 0 of the neuromorphic core, shown in FIG. 15A, during which no neurons of the neuromorphic core are simulated, various action potentials are received on first, second, and third input lines, but no memory accesses are performed. In a first action potential of the system cycle is received on a first action potential input line during logic clock cycle 2 of action potential cycle 0. In subsequent logic clock cycles 4 and X of action potential cycle 0, respective second and third action potentials are received on respective second and third action potential input lines. In the second action potential cycle, i.e., action potential cycle 1, three action potentials are received by the neuromorphic core, in respective logic clock cycles 2, 3, and Y. These action potentials can be stored in a FIFO buffer, such as buffer 102 or 502 in FIG. 1 or 5.

Figure 15B:
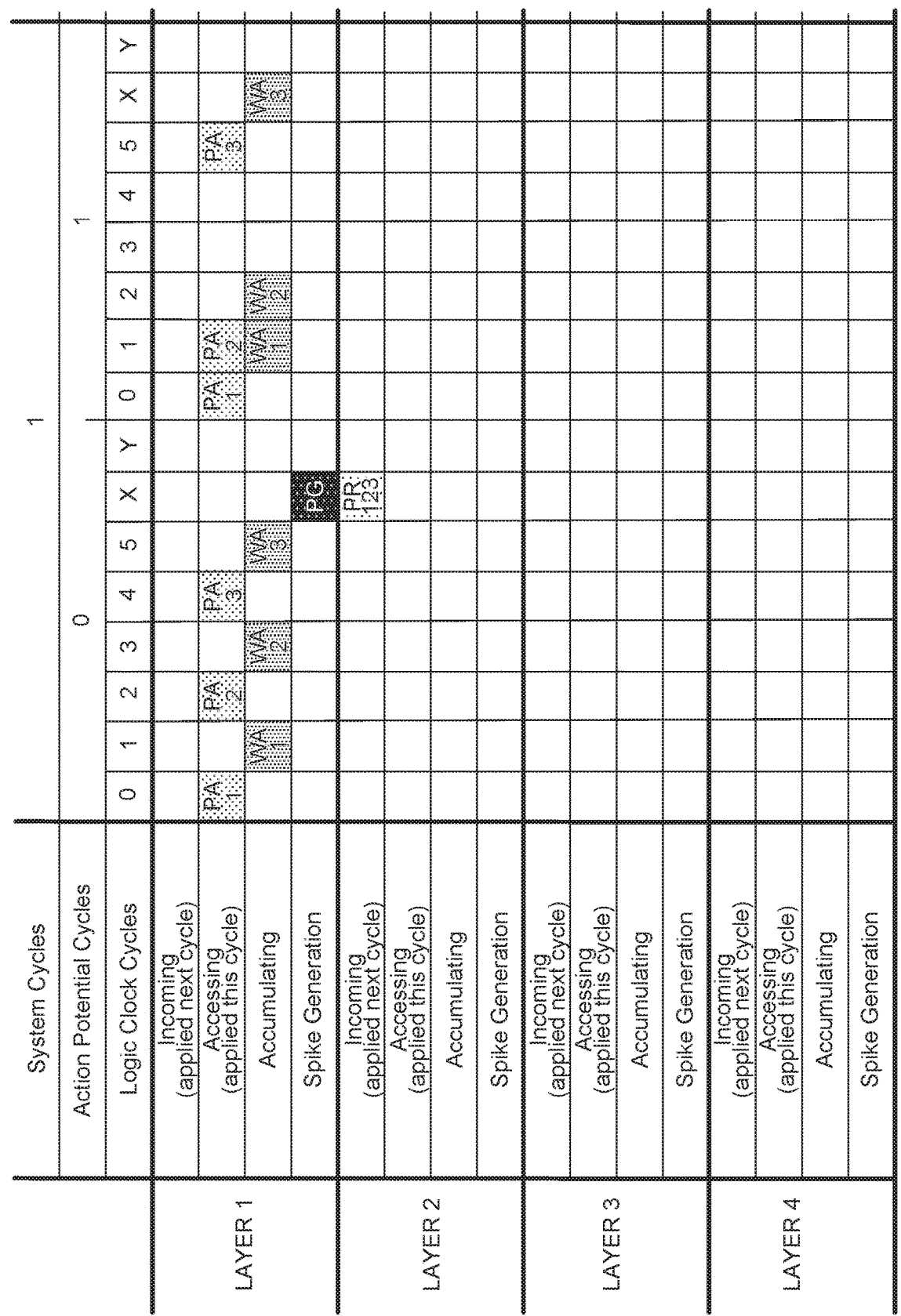

It is not until the next system cycle, i.e., system cycle 1, shown in FIG. 15B, that the neuromorphic core begins accessing the corresponding weights for the synapses on which the action potentials were received (i.e., corresponding to a particular memory column select lines) by selecting and retrieving the weights from the core's local memory, in accordance with the memory column select line on which each action potential was received and the memory row select line, which effectively designates that a neuron in layer 1 is presently simulated and chooses the row in the memory storing the synapse weights associated with that neuron. The action potentials are begun to be processed as soon as possible (i.e., starting with the first of them in the first logic clock cycle of the action potential cycle) but still with appropriate timing preserved between action potentials, such that the incoming action potentials are processed, with respect to each other, with the same amount of time between them as they were received. As such, in the first action potential cycle of system cycle 1, the three weight accesses PA1, PA2, PA3 are each performed with one logic clock cycle between them, whereas in the second action potential cycle of system cycle 1, the first two weight accesses PA1, PA2 have no logic clock cycle between them but three logic clock cycles elapse before third weight access PA3 is performed. This timing preservation can advantageously enable functionality of the neuron soma that is potential-receipt-timing-dependent. As discussed previously, the timing can be preserved by storing a "0" value in the FIFO buffer for logic clock cycles for which no action potential is received.

Thus, in system cycle 1, shown in FIG. 15B, the layer 1 neuron is simulated and thus the memory accesses are performed to retrieve the weights for the corresponding incoming pulses received in system cycle 0. Memory accesses can be shifted in time to be earlier in system cycle 1 than corresponding input pulses were received in system cycle 0. Thus, for example, as illustrated, a pulse received in logic clock cycle 2 of action potential cycle 0 of system cycle 0 has its corresponding memory access performed in logic clock cycle 0 of action potential cycle 0 of system cycle 1, representing a two-logic-clock-cycle advance. This advance helps account for pipeline delay. Incoming spikes can be received during the X and Y cycles, but the buffer can be empty at that point, so it will not output any spikes for memory accesses during these logic clock cycles. The X and Y cycles may be referred to as "pipeline adjustment cycles," and the number of such cycles selected for the particular implemented timing can correspond to the neuromorphic core pipeline depth, i.e., to the number of logic clock cycles it takes to go from a memory access to generation of a pulse from the soma. Thus, in an example where it took twenty logic clock cycles to perform a memory access, accumulate weights, and apply the accumulated weights to a soma to generate an output pulse, there would be twenty pipeline adjustment cycles, corresponding to a pipeline depth of twenty.

Still with reference to FIG. 15B, in each action potential cycle, corresponding weight accumulations (e.g., by digital accumulator 106 or 506) WA1, WA2, WA3 begin in logic clock cycles subsequent to those of each weight access. As can be seen by the emission of an action potential by the soma in logic clock cycle X of action potential cycle 0 of system cycle 1, the first three received action potentials ended up being sufficient to cause the layer 1 neuron to fire. By contrast, as can be seen from the absence of an emission in action potential cycle 1 of system cycle 1, the next three received action potentials were not sufficient to cause the layer 1 neuron to fire a second time. This may be the case even though the accumulated weights 1, 2, 3 are identical between both action potential cycles 0 and 1, the reason being that the relative timing between pulse receipts differs between action potential cycles 0 and 1 and the timing regime of FIGS. 15A-15E accommodates temporal-coded simulation rather than just rated-coded simulation. The neuromorphic core's simulation of the neuron in layer 1 is completed. At the end of the action potential cycle, built-up charge in the soma is dissipated and the process moves on.

During the same system cycle (i.e., system cycle 1), three action potentials are received substantially simultaneously (i.e., all within logic clock cycle X of action potential cycle 0) on different synapse input lines of the neuromorphic core, and are buffered as inputs to a different simulated neuron, i.e., a neuron of a second layer in a simulated neural network. One of these input spikes may be feedback from the spike generation output by the same neuromorphic core, but representative of the output of a simulated neuron of the previous layer (i.e., layer 1), i.e., this input may be the very same output generated in layer 1's logical clock cycle X of action potential cycle 0 of system cycle 1. As illustrated in FIG. 15B, no inputs are received to layer 2 in action potential cycle 1 of system cycle 1.

Figure 15C:
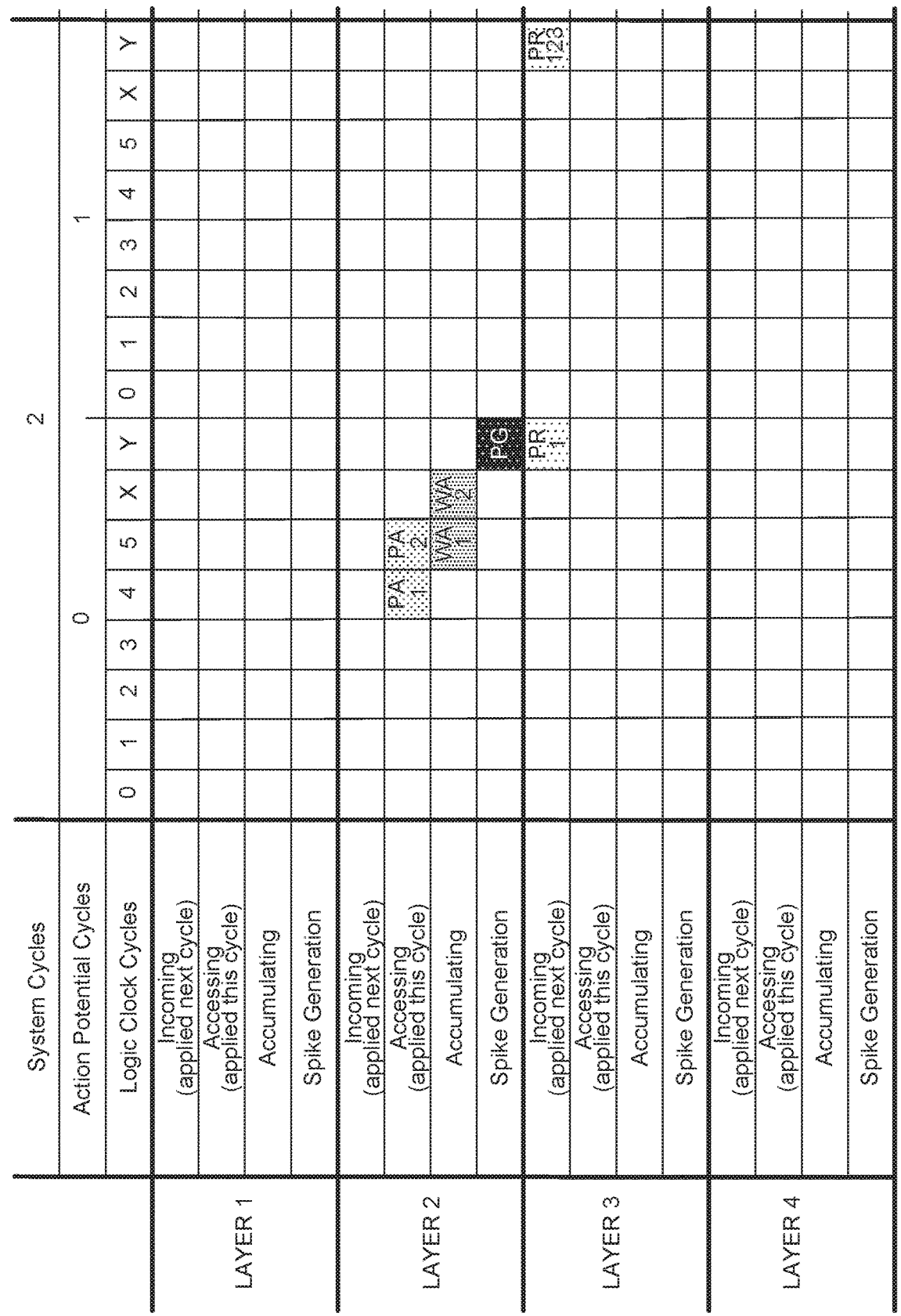

As shown in FIG. 15C, the neuromorphic core then moves on to simulation of the layer 2 neuron in the next system cycle, system cycle 2, in part by advancing of the value in the core's memory's row select line to point to the next row of the memory, or to whatever row in the memory corresponds to the layer 2 neuron simulated by the core (there being no strict requirement that weights for successively simulated neurons be stored in successive memory rows). The FIFO buffer outputs each of the spikes for respective memory access in sequence. In the illustrated example, a weight for the first of the three substantially simultaneously received input pulses is accessed in logic clock cycle 4 of action potential cycle 0 of system cycle 2, and this weight is accumulated in the next logic clock cycle, logic clock cycle 5. Similarly, a weight for the second of the three substantially simultaneously received input pulses is accessed in logic clock cycle 5 of action potential cycle 0 of system cycle 2, and this weight is accumulated in the next logic clock cycle, logic clock cycle X. However, no weight is accessed for the third of the three substantially simultaneously received input pulses in logic clock cycle X of action potential cycle 0 of system cycle 2, because, in the illustrated timing regime, no spikes are output by the FIFO buffer during pipeline adjustment cycles. The third pulse is effectively "lost." Nevertheless, by happenstance, the first two buffer-output spikes were sufficient to cause an action potential to be generated by the layer 2 simulated neuron, and an output spike is generated, as illustrated, in logic clock cycle Y of action potential cycle 0 of system cycle 2.

This output spike may be fed back into the neuromorphic core to result in the layer-3-neuron-received pulse illustrated in system cycle 2, action potential cycle 0, logic clock cycle Y in FIG. 15C. Alternatively, said input pulse to the layer 3 neuron may come from another neuron altogether. Whatever the case, it is notable that this single received pulse comes at the last logic clock cycle of the action potential cycle. Its effect, as shown in FIG. 15D, may be contrasted with the effect of three substantially simultaneously received pulses to the layer 3 neuron's input in system cycle 2, action potential cycle 1, logic clock cycle Y.

Figure 15D:
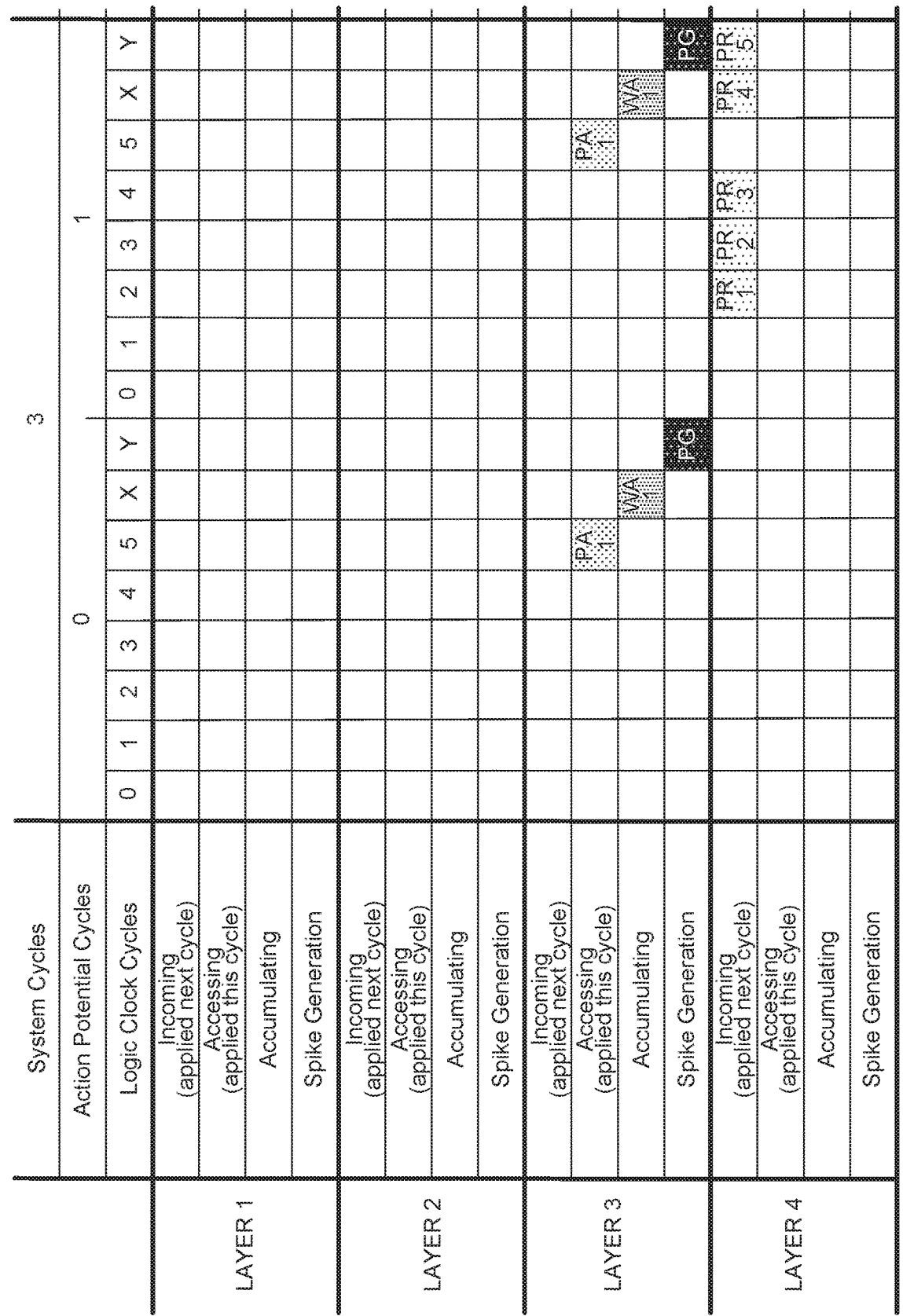

In FIG. 15D, system cycle 3 moves on to simulation of the third simulated neuron, i.e., the neuron of layer 3 in the illustrated example. The sole input spike received to this neuron in action potential cycle 0 of system cycle 2 sees its corresponding weight memory access two logic clock cycles earlier in system cycle 3, action potential cycle 0, i.e., at logic clock cycle 5 thereof. This is because, in the illustrated regime, the number of logic clock cycles that are moved back is the number of pipeline adjustment cycles. The weight from this spike is accumulated in logic lock cycle X and happens to be enough to cause a spike in logic clock cycle Y of action potential cycle 0. By contrast, only one of the three substantially simultaneously received spikes in action potential cycle 1 is processed through the pipeline. It too, happens to result in a spike being generated by the soma, as illustrated at system cycle 3, action potential cycle 1, logic clock cycle Y.

Figure 15E:
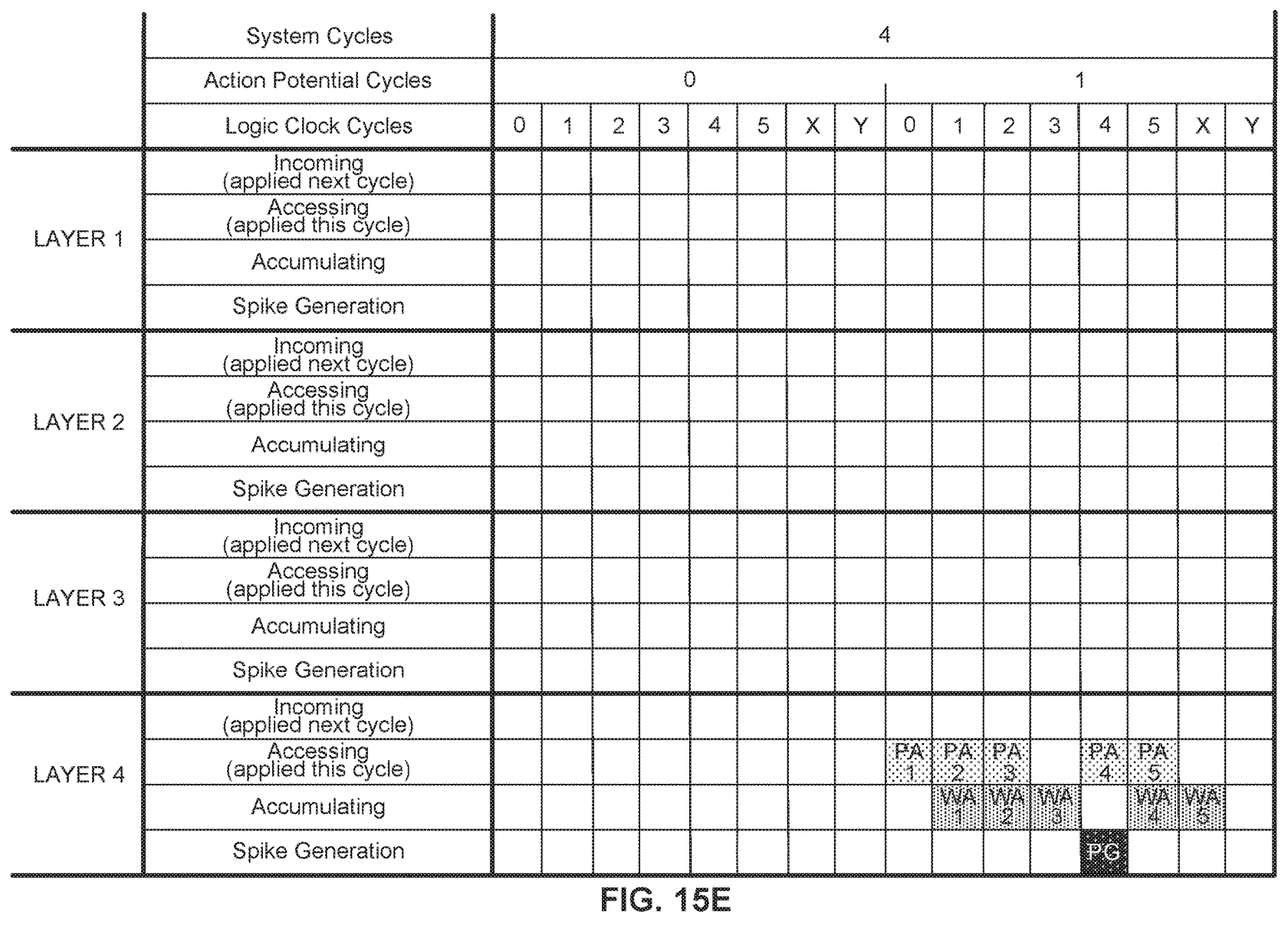

The example illustrated with respect to layer 4 shows what happens when five pulses are received, even when two of them arrive on the last two logic clock cycles of the action potential cycle. These pulses arrive to different synaptic inputs to the layer 4 neuron in action potential cycle 1 of system cycle 3, as illustrated in FIG. 15D, and are correspondingly processed in action potential cycle 1 of system cycle 4, as illustrated in FIG. 15E. As shown in FIG. 15E, the layer 4 neuron can fire as a result of accumulated weights from the first three pulses—here at system cycle 4, action potential cycle 1, logic clock cycle 4—but cannot fire again in the same action potential cycle from accumulated weights from the next three pulses. This illustrates that the logic-clock-cycle length of the action potential cycle can be determined by the desired refractory period of the neuron intended to be modeled, such that a simulated neuron is unable to fire again so quickly after having already fired in action potential cycle 1 of system cycle 4.

The example of FIGS. 15A-1E involves two action potential cycles per system cycle, i.e., two chances for each simulated neuron to fire each system cycle, but in other examples, this could be one action potential cycle per system cycle, or any arbitrary larger number, such as three, four, five, one hundred, etc., action potential cycles per system cycle. Likewise, other examples can have fewer or more than eight logic clock cycles per action potential cycle. Additionally, the larger system could be configured such that some neurons have one action potential clock and other neurons have a different action potential clock, by providing the different action potential clocks to different neuromorphic cores. This feature can improve biological suggestivity since different populations of neurons in a biological brain can have different refractory periods.

A neuromorphic core may be configured to provide a line from its soma to its own memory internal to the design of the core, without requiring an external line to provide a signal from one simulated neuron to the next sequentially processed neuron, e.g., in a next layer of a neural network.

The systems and methods described herein can implement a programmable and scalable model of one or multiple biological neurons in superconducting hardware that is fast, component- and layout-efficient, and biologically suggestive. This core can be used to build a wide variety of large-scale neural networks in hardware. The biologically suggestive operation of the neuron core provides additional capabilities to the network that are difficult to implement in software-based neural networks. The superconductive electronics that make up the core enable it to perform more synaptic operations per second per watt (SOPS/W) than is possible in comparable state-of-the-art semiconductor-based designs. As used herein, the term "synaptic operation" refers to the generation of a spike in a firing neuron based on input spikes and dendritic weights as well as the propagation of the generated spike from the firing neuron through a synapse to a target neuron. Thus, SOPS figures include both computation time and signal travel time.

With regard to the biological suggestiveness of the presently described neuromorphic core, biological neurons exhibit more complex behaviors and have more distinct states than is described by the leaky integrate and fire model. More complex simulations of neuron behavior are needed to enable new functionality in neural networks. Software simulation of complex neuron modules is prohibitively time consuming and is difficult to scale very large networks of neurons. Semiconductor-based hardware implementations of complex neuron behavior involve significant hardware overheads that also limit scaling. The presently described neuromorphic core provides an efficient way to build large neural networks that utilize neuron models that are more complex than has been possible previously.

The systems and methods of the present disclosure thus provide significantly improved performance for machine learning workloads while using less power than state-of-the-art semiconductor accelerators or neuromorphic processors. By combining superconducting digital logic, superconducting memory, and biologically-inspired superconducting analog circuits to create a scalable and programmable superconducting neuromorphic core, the described systems and methods leverage the benefits of superconductivity and have a different structure and operation than non-superconducting neuromorphic cores. For example, the described systems and methods provide much lower energy expenditure, and, accordingly, lower operational cost than neuromorphic processor designs that use standard room-temperature semiconductor-electronics CPUs to perform calculations for the neuron. As another example, the shared-synapse architecture of the described systems and methods advantageously provide more versatile neuron functioning than systems that implement a shared-dendrite architecture and use analog circuits for synapses.

Moreover, the described systems and methods enable fuller functionality than has been provided by existing neuromorphic devices. As examples, the described systems and methods use both analog and digital components to create neuron cores, and thus differ from purely digital designs that may be operationally slower and/or less efficient in terms of component count and/or energy expenditure. Furthermore, the described systems and methods use a more centralized soma circuit to determine spiking behavior, leveraging an accumulator to sum up the incoming weight at the soma, and thus differ from designs that implement neuronal soma as one or more dendritic membrane circuits that determine the spiking behavior of the neuron, and therefore lack an accumulator in the soma. The centralized soma and weight accumulation design of the present systems and methods advantageously preserves the timing relationships between spikes in a more straightforward fashion.

As compared to existing or proposed neural network accelerator designs, the systems and methods described herein more faithfully replicate biological neurons by explicitly implementing hardware circuits that individually perform the functions of somas, axons, dendrites and synaptic connections, thereby potentially providing improved performance over designs that merely perform multiply-accumulate operations on matrices of numbers using standard digital arithmetic circuits. Such designs may be organized to accelerate the multiply—accumulate operations that make up a significant portion of convolutional neural network and deep neural network algorithms, but do not provide the versatility of hardware neural networks that reproduce the functioning of biological neurons, as found in the present systems and methods.

Still further, the described systems and methods have scalability, programmability, and biological-fidelity advantages over proposed or existing superconducting neural networks that are either not mixed-signal, not programmable, or only represent part of the neuron, such as the soma. The present systems and methods are more scalable than designs that rely on a large number of control wires required for each neuron, and lack time multiplexing. Scalability is an especially important property of components used in building neural networks having a large number of neurons. For example, the ImageNet Large Scale Visual Recognition Challenge classifier AlexNet, built by Alex Krizhevsky, Ilya Sutskever, and Geoffrey E. Hinton of the University of Toronto to perform object recognition tasks from millions of images, was built of an artificial neural network having 650,000 neurons in eight layers. The mixed-signal approach offered herein provides other efficiencies over designs that may use SQUIDs and superconducting loops for all functions. The present systems and methods are more programmable than designs that can only adjust the operation of the network via external bias currents.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting neuromorphic core comprising:
   input lines configured to receive single flux quantum (SFQ) pulses;
   a superconducting digital memory array configured to store synapse weight values in columns corresponding to different neural synapses that provide inputs to a single neuron simulated by the neuromorphic core and in rows corresponding to different neurons sequentially simulated by the neuromorphic core;
   a superconducting digital accumulator configured to sum synapse weight values retrieved from the memory array during an accumulation time period;
   a superconducting digital-to-analog converter configured to convert the summed-weight accumulator output into an analog signal; and
   superconducting analog soma circuitry configured to provide an SFQ pulse as an output of the neuromorphic core based on the analog signal exceeding a threshold.

2. The neuromorphic core of claim 1, wherein each different row of the memory array stores synapse weight values for a simulated neuron in a respective layer of an artificial neural network.

3. The neuromorphic core of claim 1, wherein a first row of the memory array stores synapse weight values for a first simulated neuron in a layer of an artificial neural network, and a second row of the memory array stores synapse weight values for a second simulated neuron in the same layer of the artificial neural network.

4. The neuromorphic core of claim 1, further comprising an incoming spike buffer configured to store SFQ pulses provided as inputs to the neuromorphic core until either of:
the start of a next system cycle during which the neuromorphic core processes inputs to a neuron of a next layer of an artificial neural network being simulated, or
the memory array is available to sequentially receive them as column select inputs to the memory array.

5. The neuromorphic core of claim 1, wherein the soma circuitry comprises only two Josephson junctions and only three inductors.

6. The neuromorphic core of claim 1, wherein the soma circuitry comprises an array of soma circuits each simulating a respective cell body of a different neuron sequentially simulated by the neuromorphic core.

7. The neuromorphic core of claim 6, wherein each soma circuit in the array comprises only two Josephson junctions and only three inductors.

8. The neuromorphic core of claim 1, configured to sequentially simulate at least four neurons in at least four respective layers of a neural network.

9. The neuromorphic core of claim 8, having a memory array of at least four rows.

10. The neuromorphic core of claim 9, wherein the soma circuitry comprises an array of at least four soma circuits each simulating a respective cell body of a different neuron sequentially simulated by the neuromorphic core.

11. A network of at least four instances of the neuromorphic core of claim 1, the output of each core instance being directly connected to the inputs of each of the other core instances.

12. A network of instances of the neuromorphic core of claim 1, the inputs and output of each core instance being connected to a superconducting digital distribution network.

13. The core-instance network of claim 12, configured provide simulation of a neural network comprising at least one thousand neurons.

14. A method comprising:
receiving an input signal as an input single flux quantum (SFQ) pulse representing an action potential generated by a simulated neuron;
accessing, from a superconducting digital memory array, a synapse weight value based on the input signal;
accumulating synapse weight values accessed during a time period;
converting the accumulated weight values to an analog signal; and
emitting an output signal as an output SFQ pulse based on a comparison of the analog signal to a threshold.

15. The method of claim 14, further comprising:
receiving a second input signal as a second SFQ pulse representing an action potential generated by a different simulated neuron; and
storing the second input signal in a buffer based on either a system cycle clock indicating a next system cycle or a signal from the memory array indicating its unavailability.

16. The method of claim 14, further comprising:
receiving a plurality of additional input signals as SFQ pulses representing action potentials generated by other simulated neurons; and
storing the additional input signals in a buffer for periodic sequential release to corresponding different column select lines of the memory array.

17. The method of claim 16, wherein the buffer is organized as a first-in, first-out (FIFO) buffer and is configured to represent input signals received during respective time periods as one of two binary states and to represent the absence of input signals received during other respective time periods as the other of the two binary states, so as to preserve the timing relationship between spike arrival times.

18. The method of claim 16, wherein the converting the accumulated weight values to an analog signal is performed one of:
continuously, or
beginning no earlier than a designated input cutoff time and beginning no later than the end of the accumulation time period.

19. A programmable hardware-based artificial neural network comprising:
a superconducting integrated circuit comprising at least one neuromorphic core, the at least one neuromorphic core being configured to sequentially simulate multiple neurons in the neural network, the at least one neuromorphic core comprising:
a superconducting digital memory array having column select lines and row select lines configured to select a word in the digital memory array representative of a programmable weight associated with a particular synaptic input of a particular neuron simulated by the at least one neuromorphic core during a system cycle; and
superconducting analog soma circuitry configured to provide a single flux quantum (SFQ) pulse as an output of the neuromorphic core based on processed outputs from the digital memory array.

20. The artificial neural network of claim 19, wherein the at least one neuromorphic core further comprises:
a buffer to store input signals and to provide them to the column select lines;
a pipelined digital accumulator to sum weights retrieved from the memory array; and
a digital-to-analog converter to provide an analog signal to the soma circuitry based on the weights summed by the accumulator.

* * * * *